United States Patent [19]
Hamasaki et al.

[11] Patent Number: 5,682,162
[45] Date of Patent: Oct. 28, 1997

[54] OVERSAMPLING DIGITAL-TO-ANALOG CONVERTER WITH AUTO-MUTING FEATURE

[75] Inventors: Toshihiko Hamasaki, Yokohama; Yoshiaki Shinohara, Tokyo, both of Japan

[73] Assignee: Burr-Brown Corporation, Tucson, Ark.

[21] Appl. No.: 577,148

[22] Filed: Dec. 22, 1995

[30]     Foreign Application Priority Data

Dec. 27, 1994   [JP]   Japan ..................... 6-325932

[51] Int. Cl.$^6$ ........................................... H03M 3/00
[52] U.S. Cl. ................................. 341/144; 341/77
[58] Field of Search ........................... 341/143, 144, 341/77

[56]              References Cited

U.S. PATENT DOCUMENTS 4,812,815   3/1989   Miyakoshi et al. ............... 455/612
5,200,750   4/1993   Fushiki et al. ................... 341/143

OTHER PUBLICATIONS

Diagram of Burr-Brown PCM1710U, Dual Voltage Output CMOS Delta-Sigma DAC with On-Chip Digital Filter, Apr. 1994.

*Primary Examiner*—Jeffrey A. Gaffin
*Assistant Examiner*—Peguy Jean Pierre
*Attorney, Agent, or Firm*—Cahill, Sutton & Thomas P.L.C.

[57]              ABSTRACT

An oversampling digital-to-analog converter is provided with an auto-muting circuit which reduces noise in an analog output signal when a digital input signal remains at zero. Auto-muting circuit includes an input reference level code detection section which detects an input reference level code in the digital input signal. An output reference level code in a modulated output generated from an oversampling modulator is detected by an output reference level code detection section provided in the auto-muting circuit. A modulated output alteration section is provided which operates in response to the result of the detections to selectively pass the modulated output without any alteration or alter the modulated output by substituting it with output reference level codes.

30 Claims, 17 Drawing Sheets

ONE DATA INTERVAL

ONE DATA INTERVAL

OVERSAMPLING DIGITAL-TO-ANALOG CONVERTER WITH AUTO-MUTING FEATURE

BACKGROUND OF THE INVENTION

1. Field of the Invention

The present invention relates to an oversampling digital-to-analog converter and, in particular, to a digital-to-analog converter having an auto-muting feature for improved reduction of noise.

2. Description of Related Art

In the field of digital-to-analog converters (also called "DAC" hereinafter), which convert a digital signal to an analog signal, there have been widely used oversampling DACs with oversampling modulators. The oversampling modulator performs oversampling of a digital input signal at a frequency higher than twice the upper limit frequency of a required signal frequency band such that any quantization noise which could otherwise occur in the signal frequency band will be moved out of the band and can be blocked by a suitable analog filter. In such an oversampling DAC, even when the digital input signal happens to represent a reference level code, i.e., one of the codes for the digital input signal, for example a zero level, the constantly continued modulation of the signal by an oversampling modulator in the DAC will cause a modulated digital output produced in response to the zero level input not to continuously remain at a reference level code, i.e., one of the codes for the modulated output, for example a bipolar zero level during the zero level input, so that non-bipolar-zero levels may occur. This means that the analog output from the oversampling DAC will not remain at a zero level even when it should do, resulting in the generation of additional noise, which leads to a decrease in the signal-to-noise ratio (SNR) of the DAC. For example, the oversampling DAC causes noise on a compact disk (CD) during intermissions between recorded music, making the intermissions somewhat intrusive.

Some conventional oversampling DACs are provided with an auto-muting circuit for reduction of noise due to the above described operation of the oversampling modulator. A typical auto-muting circuit sets or resets substitution of the output from the oversampling modulator in the DAC with a bipolar zero level in response to the presence or absence of a zero level in the digital input signal received by the DAC. Specifically, the substitution operation is set (mute-on) when a zero level has been continued for a predetermined period of time or a predetermined number of times in the digital input signal. Thereafter, when a non-zero level occurs in the digital input signal, the substitution operation is reset (mute-off) so as to pass the output of the oversampling modulator to the next stage without any substitution. This improves the SNR of the DAC.

The oversampling DAC having the above described conventional muting circuit thus substantially reduces noise at the time of zero inputs and considerably improves the SNR at the zero inputs. Nevertheless, there is a need in some applications such as audio applications to provide a DAC which has a higher SNR and a wider dynamic range even when switching is made between mute-on and mute-off.

SUMMARY OF THE INVENTION

Accordingly, it is an object of the present invention to provide a method of auto-muting and an auto-muting circuit for use in an oversampling digital-to-analog converter, for further improving the SNR at the time of zero inputs or switching between mute-on and mute-off.

It is another object of the present invention to provide an oversampling digital-to-analog converter having such auto-muting circuit.

In order to achieve these and other objects, in an oversampling digital-to-analog converter for converting a digital input signal to an analog output signal, said converter including an oversampling modulator means for receiving said digital input signal to produce a first modulated output signal, there is provided in accordance with one aspect of the present invention a method of automatically muting said analog output signal when said digital input signal represents a reference level code, comprising the steps of: a) providing an input reference level code detection signal when a reference level code for said digital input signal is detected in said digital input signal; b) providing an output reference level code detection signal when a reference level code for oversampling modulation is detected in said first modulated output signal; c) providing an alteration timing control signal, said alteration timing control signal indicating one of first and second statuses in response to said input and output reference level code detection signals; and d) causing said first modulated output signal to be outputted as an output of said oversampling modulator means when said alteration timing control signal indicates said first status, and causing said reference level code for said oversampling modulation to be outputted as the output of said oversampling modulator means when said alteration timing control signal indicates said second status.

In accordance with another aspect of the present invention there is provided an auto-muting circuit for use in an oversampling digital-to-analog converter for converting a digital input signal to an analog output signal, said converter including an oversampling modulator means for receiving said digital input signal and subjecting the digital input signal to oversampling modulation to produce a first modulated output signal, said auto-muting circuit comprising: a) modulated output alteration means connected to receive said first modulated output signal for generating a second modulated output signal, said second modulated output signal being equal to said first modulated output signal in a first status and a reference level code for said oversampling modulator means in a second status; b) input reference level code detector means connected to receive said digital input signal for generating an input reference level code detection signal when a reference level code for said digital input signal is detected in said digital input signal; c) output reference level code detector means connected to receive said first modulated output signal for generating an output reference level code detection signal when a reference level code for said oversampling modulation is detected in said first modulated output signal, and d) modulated output alteration timing control means connected to receive said input and output reference level code detection signals for generating an alteration timing control signal, said alteration timing control signal selectively indicating one of said first and second statuses to said modulated output alteration means in response to said input and output reference level code detection signals.

In accordance with the present invention, the generation of said alteration timing control signal may be performed by i) a change in status of said alteration timing control signal from said first status to said second status at a first point of time at which said input reference level code detection signal has continued for a period of time equal to or longer than a first period of time and at which said output reference level code detection signal is present; and ii) a change in status of said alteration timing control signal from said second status to said first status at a second point of time at which said input reference level code detection signal has become absent after having continued for a period of time equal to or longer than said first period of time and at which said output reference level code detection signal is present. In accordance with the present invention, each of said first and second points of time may be a point of time at which the value of the accumulated energy of said first modulated output signal is below a predetermined value.

Further, in accordance with the present invention, the generation of said alteration timing control signal may be performed by i) a changei in status of said alteration timing control signal from said first status to said second status when said input reference level code detection signal has continued for a period of time equal to or longer than a first period of time and if said output reference level code detection signal has continued for a second period of time; and ii) a change in status of said alteration timing control signal from said second status to said first status when said input reference level code detection signal has become absent after having continued for a period of time equal to or longer than said first period of time and if said output reference level code detection signal has continued for a third period of time.

In the method of auto-muting and the auto-muting circuit according to the present invention, the on-off switching of the mute function may be performed in response to the level of the output of said oversampling modulator, or to the accumulated energy of the oversampling modulator output, or to the length of the period of time for which the reference level code for the modulator output continues.

Further, in accordance with the present invention, said second and third periods of time may have different lengths from each other. In such a case, said modulated output alteration timing control means may comprise i) first counter means for measuring said first period of time by counting a first number of continuously generated said input reference level code detection signals; ii) second counter means for measuring said second period of time by counting a second number of continuously generated said output reference level code detection signals; and iii) third counter means for measuring said third period of time by counting a third number of continuously generated said output reference level code detection signals.

Further, in accordance with the present invention, said second and third periods of time may have the same length. In such a case, said modulated output alteration timing control means may comprise i) first counter means for measuring said first period of time by counting a first number of continuously generated said input reference level code detection signals; and ii) second counter means for measuring said second period of time by counting a second number of continuously generated said output reference level code detection signals.

Moreover, in accordance with the present invention, each of said second and third periods of time may be of a fixed or variable length.

Further, in accordance with the present invention, said oversampling digital-to-analog converter may comprise conversion means connected to receive said second modulated output signal for converting said second modulated output signal to said analog output signal to produce it at said output terminal. In such a case, said conversion means may comprise digital pulse conversion means for receiving said second modulated output signal and converting it to an analog signal. Alternatively, said conversion means may comprise i) digital pulse conversion means for receiving said second modulated output signal and converting it to an analog signal; and ii) an analog filter for receiving said analog signal to produce said analog output signal.

Moreover, the present invention may be arranged such that i) said oversampling modulator includes a delta-sigma modulator for producing said first modulated output signal as a multi-quantization-level and multi-bit signal; and ii) said digital pulse conversion means includes a multi-bit, digital-to-analog converter. Alternatively, the present invention may be arranged such that i) said oversampling modulator includes a delta-sigma modulator for producing said first modulated output signal as a multi-quantization-level, single-bit and pulse-width-modulated signal; and ii) said digital pulse conversion means includes a pulse-width converter. Again alternatively, the present invention may be arrange such that i) said oversampling modulator includes a delta-sigma modulator for producing said first modulated output signal as a multi-quantization-level, single-bit and pulse-density-modulated signal; and ii) said digital pulse conversion means includes a pulse-density converter.

In accordance with a further aspect of the invention there is provided an oversampling digital-to-analog converter for converting a digital input signal to an analog output signal, comprising: a) an input terminal for receiving said digital input signal; b) an output terminal for producing said analog output signal representative of said digital input signal; c) oversampling modulator means connected to receive said digital input signal from said input terminal for generating a first modulated output signal, said first modulated signal being derived by subjecting the digital input signal to oversampling modulation; d) modulated output alteration means connected to receive said first modulated output signal for generating a second modulated output signal, said second modulated output signal being equal to said first modulated output signal in a first status and a reference level code for said oversampling modulator means in a second status; e) conversion means connected to receive said second modulated output signal for converting said second modulated output signal to said analog output signal to produce the resultant signal at said output terminal; f) input reference level code detector means connected to receive said digital input signal from said input terminal for generating an input reference level code detection signal when a reference level code for said digital input signal is detected in said digital input signal; g) output reference level code detector means connected to receive said first modulated output signal for generating an output reference level code detection signal when a reference level code for said oversampling modulation is detected in said first modulated output signal; and h) modulated output alteration timing control means connected to receive said input and output reference level code detection signals for generating an alteration timing control signal, said alteration timing control signal selectively indicating one of said first and second statuses to said modulated output alteration means in response to said input and output reference level code detection signals.

BRIEF DESCRIPTION OF THE DRAWINGS

These and other features and advantages of the present invention will be appreciated from the following detailed description with reference to the accompanying drawings in which:

FIG. 10 shows a waveform of an analog output signal LAFOUT (or RAFOUT) produced from the DAC system B shown in FIG. 3 when the muting is switched from off to on;

DETAILED DESCRIPTION OF THE PREFERRED EMBODIMENTS

Figure 1:
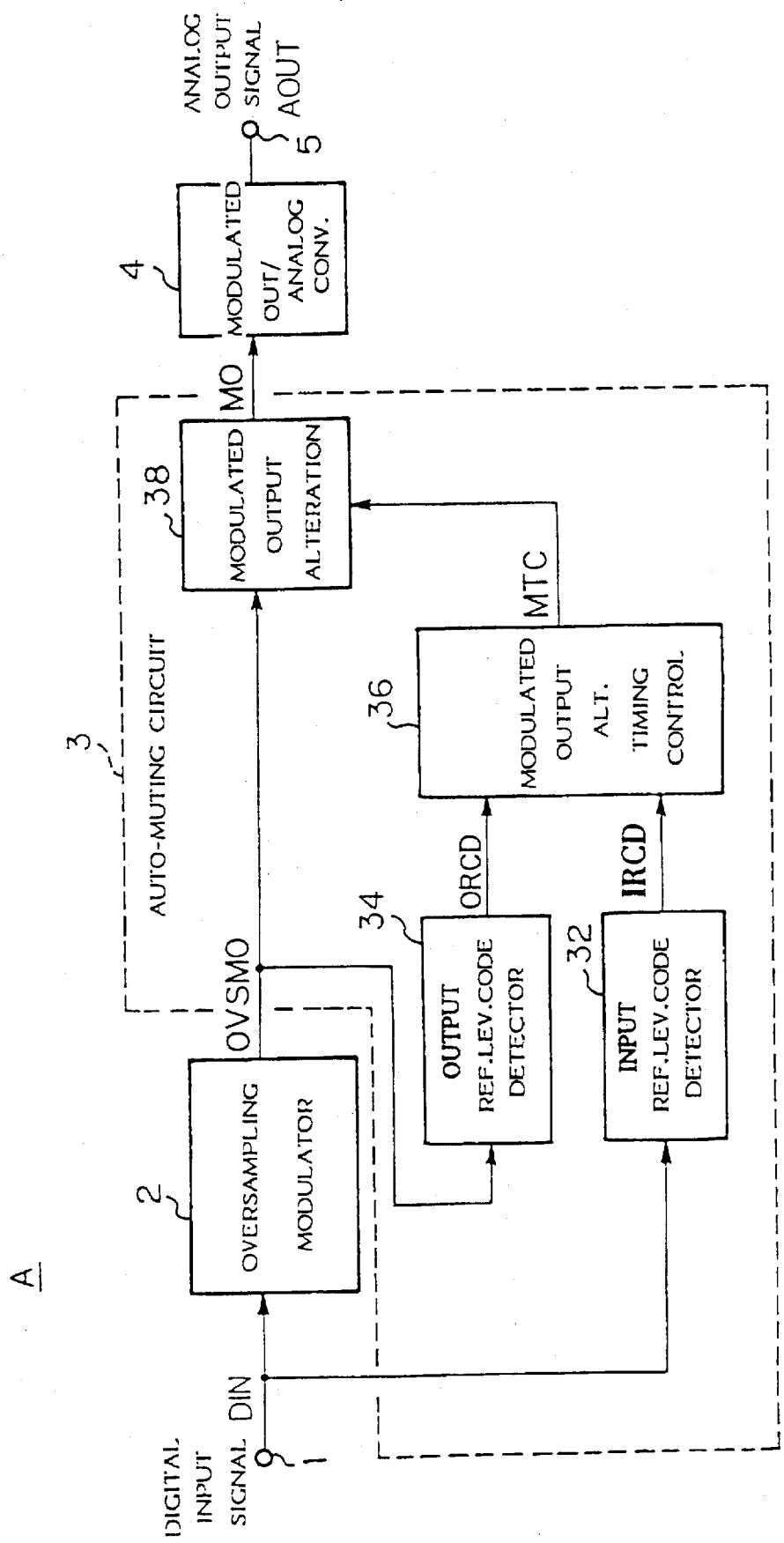
FIG. 1 is a block diagram of an oversampling digital-to-analog converter (DAC) system A having an auto-muting function according to the present invention, which has a basic arrangement and forms a first embodiment of the present invention.

Referring now to the drawings and initially to FIG. 1 thereof, there is illustrated a block diagram showing a first embodiment of an oversampling digital-to-analog converter (DAC) system with auto-muting feature according to the present invention, and generally designated by the character A. The oversampling DAC system A is of a basic arrangement. As shown, the system A has an input terminal 1 to which a digital input signal DIN to be converted to an analog output signal is applied, an oversampling modulator 2 having an input connected to the input terminal 1, an auto-muting circuit 3 having one input connected to an output of the oversampling modulator 2 and the other input connected to the input terminal 1, a modulated output/analog conversion section 4 having an input connected to an output of the auto-muting circuit 3, and an output terminal 5 which receives an analog output signal AOUT produced at an output of the conversion section 4. The oversampling modulator 2 is a delta-sigma modulator or a sigma-delta modulator, and oversamples the digital input signal DIN received at the input terminal 1 to produce a modulated output signal OVSMO which carries information along the time axis represented by the pulse-density of pulses having a pulse frequency higher than the upper frequency of the signal frequency band of the digital input signal DIN.

The auto-muting circuit 3 serves to mute the analog output signal AOUT when the input signal DIN is at a reference level code. The auto-muting circuit 3 includes an input reference level code detector section 32 having an input connected to receive the input signal DIN and an output reference level code detector section 34 having an input connected to receive the modulated output signal OVSMO. When the input detector section 32 detects in the input signal DIN the code ICRL for an input reference level (such as a zero level) (i.e., one of the codes defined for the digital input signal DIN), the detector 32 generates an ICRL-detection signal IRCD at the output thereof. When the output detector section 34 detects in the modulated output OVSMO the code OCRL for an output reference level (such as a bipolar zero level) (i.e., one of the codes defined for the modulated output signal OVSMO), the output detector 34 generates an OCRL-detection signal ORCD at the output thereof. The muting circuit 3 further includes a modulated output alteration timing control section 36 having inputs connected to receive the detection signals IRCD and ORCD, respectively. The alteration timing control section 36 generates an alteration timing control signal MTC which selectively specifies one of an alteration set state and an alteration reset state depending on the detection signals IRCD and ORCD. The muting circuit 3 further includes a modulated output alteration section 38 which has an input connected to receive the modulated output OVSMO, a control input connected to receive the control signal MTC and an output from which a muting circuit output MO is provided. The alteration section 38 serves to pass the modulated output OVSMO without any alteration and provide the same as the muting circuit output MO during the time when the control signal MTC represents the alteration reset state (or mute-off state), while to provide output reference level codes OCRL rather than the modulated output OVSMO as the muting circuit output MO during the time when the control signal MTC represents the alteration set state (or mute-on state).

The described muting circuit output MO is applied to the conversion section 4 which converts the received digital output MO into analog form to produce the analog output signal AOUT at the output terminal 5. As the result, a signal in analog form and corresponding to the modulated output OVSMO is produced during the alteration reset state (or mute-off state), while a signal in analog form and corresponding to the output reference level code OCRL, i.e., a zero level analog signal is produced during the alteration set state (or mute-on state).

Figure 2:
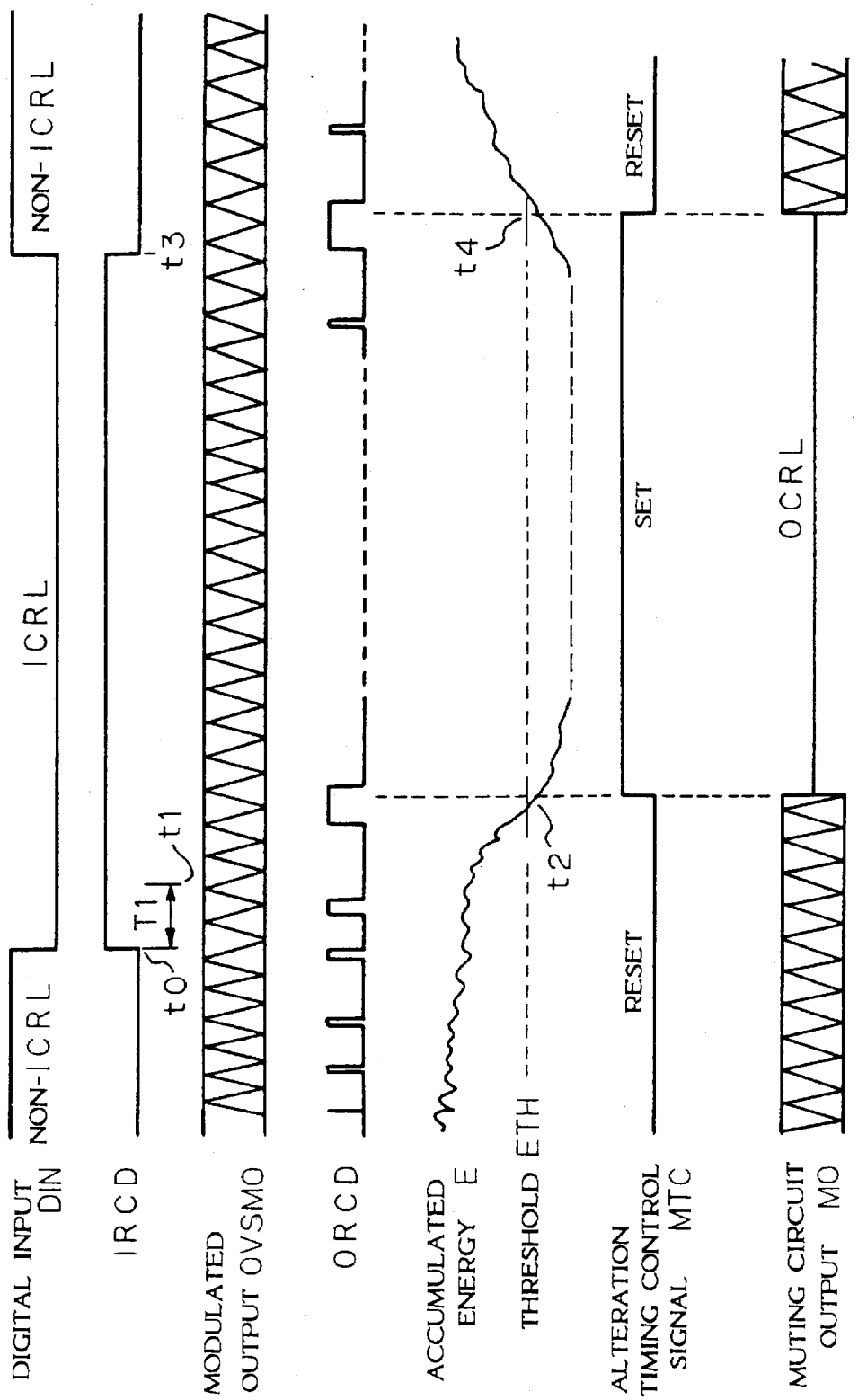
FIG. 2 is a timing chart illustrating the operation of the DAC system shown A in FIG. 1.

Referring next to FIG. 2, it will be described how the alteration timing control signal MTC is Generated in the alteration timing control section 36. In FIG. 2, a waveform of the modulated output OVSMO is shown only schematically. If the input reference level code (ICRL) detection signal IRCD exists from a time t0 and continues to exist after a time t1 which is a first period of time T1 after the time t0, and if the output reference level code (OCRL) detection signal ORCD is present, the control section 36 serves to cause the alteration timing control signal MTC to undergo a transition from the alteration reset state to the alteration set state at a time t2. Then, if the ICRL detection signal IRCD ceases to exist at a time t3 after having continued to exist for more than the first period of time T1, and if the OCRL detection signal ORCD is present, the control section 36 also serves to cause the alteration timing control signal MTC to undergo a transition from the alteration set state to the alteration reset state at a time t4. Each of the times t2 and t4 is selected to be a point of time at which the (absolute) value of the accumulated energy E of the modulated output OVSMO is below a predetermined threshold value ETH, in order to minimize the occurrence or the magnitude of momentary pulse noise appearing in the muting circuit output MO. The value of the accumulated energy E depends on the past conditions of the modulated output OVSMO till each of the time t2 and t4. The predetermined threshold value ETH may be selected to be lower as the noise reduction requirement is more severer. In the manner described above, the muting circuit output MO will comprise the reference level codes OCRL during the alteration set state, as shown.

Figure 3:
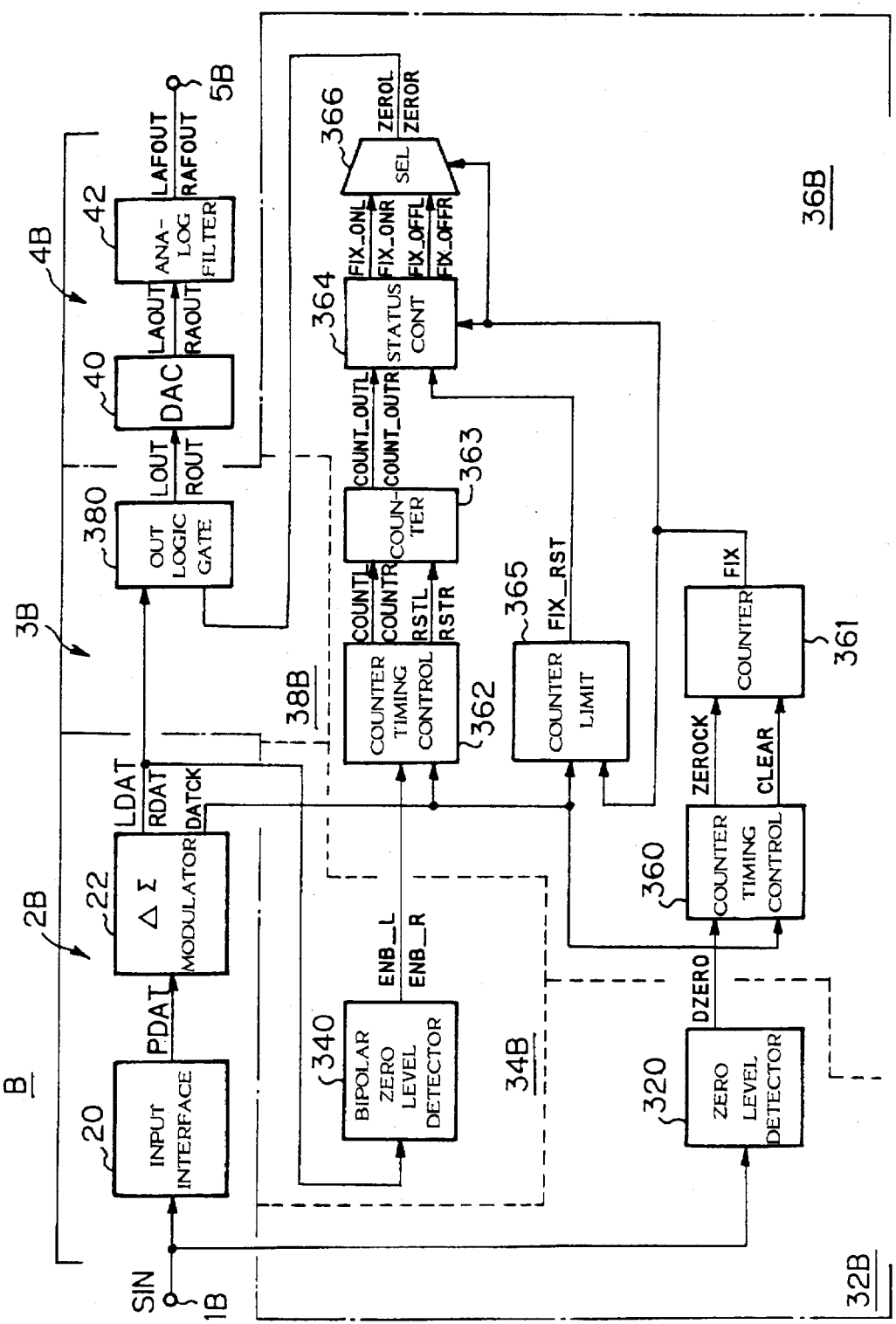
FIG. 3 is a block diagram of an oversampling DAC system B which has a more specific arrangement of the system A shown in FIG. 1 and forms a second embodiment of the present invention.

Referring next to FIG. 3, there is shown an oversampling DAC system B according to the present invention which forms a second embodiment of the present invention and has a more specific arrangement than the basic arrangement shown in FIG. 1. In FIG. 3, like elements and components are designated by the same reference numerals as in FIG. 1, with character "B" attached at the ends thereof. The oversampling DAC system B is designed specifically for audio applications and comprises an input terminal 1B to which a digital stereo input signal SIN in serial form is applied, oversampling modulator section 2B, an auto-muting circuit section 3B, a modulated output/analog conversion section 4B and an output terminal 5B. The digital input signal SIN may be, for example, a serial stereo signal derived from a music recorded compact disk, which comprises left-channel (L-ch) data words and right-channel (R-ch) data words which are arranged alternately with a pair of L-ch data word and R-ch data word being contained in one period Ts which is equal to 1/fs, where "fs" is a sampling frequency (e.g., 44.1 kHz). Each data word comprises 16 (sixteen) bits. The reference level of the signal is zero level (the voltage corresponding to this zero level is 0 V (volts)).

The oversampling modulator 2B, which receives the serial input SIN, includes an input interface 20 and a delta-sigma modulator 22. The input interface 20 converts the serial input signal SIN into a parallel form to produce a data word PDAT of 20-bit width. The delta-sigma modulator 22 separates the data word PDAT into L-ch and R-ch words and performs delta-sigma modulation of each of the separated words to produce L-ch modulated word LDAT and R-ch modulated word RDAT in parallel.

Figure 4:
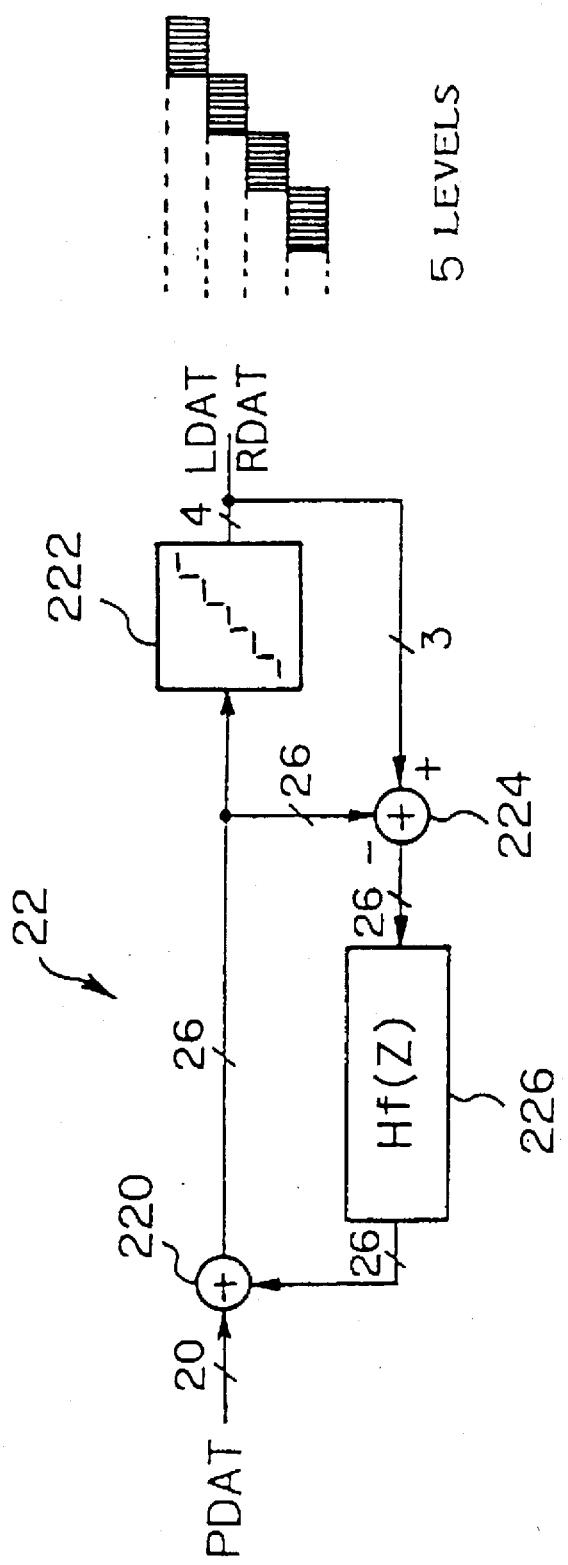
FIG. 4 is a block diagram showing basic elements of a multi-level, multi-bit, delta-sigma modulator used as a delta-sigma modulator shown in FIG. 3.

FIG. 4 shows the main circuit sections of the delta-sigma modulator 22 used in the embodiment shown in FIG. 3. The modulator 22 is a conventional and known multi-level, multi-bit delta-sigma modulator, i.e., a type of modulator which generates a modulated output which has multiple quantization levels represented by different multiple levels and also has multiple parallel bits. As shown in FIG. 4, the modulator 22 includes an adder 220 having one input connected to receive the L-ch or R-ch word of the data word PDAT, a quantizer 222 having an input connected to the output of the adder 220, a second adder 224 having one input connected to the output of the quantizer 222 and the other input connected to the output of the adder 220 and a filter 226 having an input connected to the output of the second adder 224. The output of the filter 224 is connected to the other input of the first mentioned adder 220. Since the digital input SIN has a maximum signal frequency of 20 kHz, the sampling frequency fs is selected to be 44.1 kHz. Then, the frequency of the system-clock SCK, which is the clock for operation of the modulator 22, is for example 16.9344 MHz (=384 fs). Further, in this case, data-clock DATCK is preferably 2.1168 MHz (=48 fs). The quantizer 222 has five quantization levels which are designated as −2, −1, 0, 1 and 2 (these levels correspond to voltage levels of 0.9 V, 1.7 V, 2.5 V, 3.3 V and 4.1 V, respectively). The quantization levels are presented by a 4-bit representation, that is, LDAT0–3 and RDAT0–3 each of which is "0000", "0001", "0011", "0111" or "1111". Among the five codes, the reference level code is "0011" which corresponds to a bipolar zero level in the quantization levels.

Figure 5:
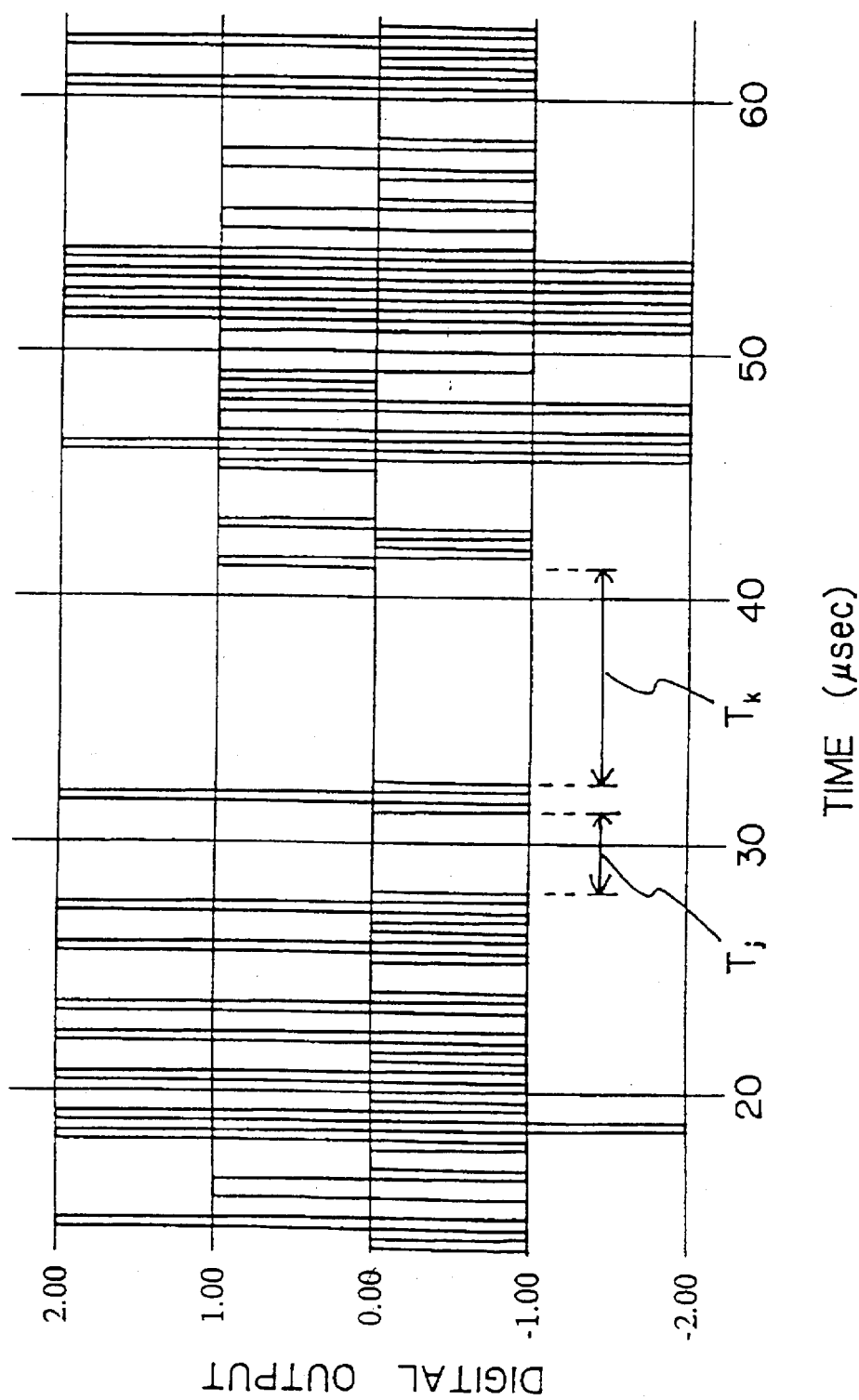
FIG. 5 is a graph illustrating a modulated data word LDAT (for L-channel) or RDAT (for R-channel) produced from the delta-sigma modulator shown in FIG. 4 with the vertical axis indicating the quantization levels represented by the modulated data word, wherein the illustrated modulated data word is outputted from the modulator during a period of time in which the digital input signal SIN remains at a reference level code or a zero level.

FIG. 5 is a graph showing an example of a sequence of the L-ch or R-ch modulated digital data words LDAT (=LDAT0–3) or RDAT (=RDAT0–3) which are outputted from the modulator 22 having the arrangement described above. The vertical axis of the graph indicates the quantization levels represented by the digital data output. The modulated output example shown in FIG. 5 is produced during a period of time in which the digital input SIN remains at the reference level code thereof, i.e., a zero level. As seen from the graph, the modulated output will not continuously remain at bipolar zero level even when the input SIN remains at zero level.

Referring again to FIG. 3, the subsequent auto-muting circuit 3B includes an input reference level code detector section 32B, an output reference level code detector section 34B, a modulated output alteration timing control section 36B and a modulated output alteration section 38B, which are similar to corresponding elements in FIG. 1. In this embodiment, the detector section 32B comprises a zero level detector 320 having an input connected to receive the serial input SIN, while the output detector section 34B comprises a bipolar zero level detector 340 having an input connected to receive the modulated data words LDAT and RDAT.

Figure 6:
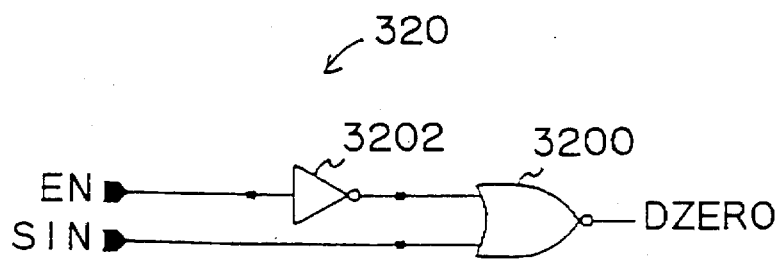
FIG. 6 is a logic diagram showing a zero level detector within the DAC system B shown in FIG. 3 in detail.
Figure 7:
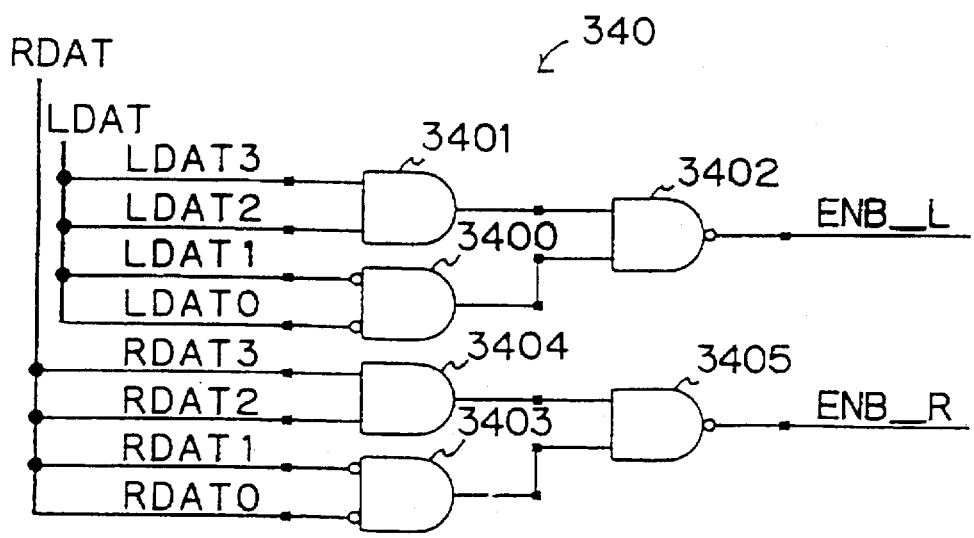
FIG. 7 is a logic diagram showing a bipolar zero level detector within the DAC system B shown in FIG. 3 in detail.

Referring now to FIGS. 6 and 7, the detectors 320 and 340 will be described in detail. As shown in FIG. 6, the detector 320 includes a NOR gate 3200 having one input connected to receive the serial input SIN, the other input of the NOR gate 3200 being connected to receive, via an inverter 3202, a function enable signal EN for enabling the auto-muting function. The gate 3200 produces at the output thereof a zero detection signal DZERO, which is high only when the function enable signal EN is high (=1) and the input SIN is low (=0), indicating the detection of a zero level in the input SIN.

The detector 340 shown in FIG. 7 includes two sets of gate circuits 3400–3402 and 3403–3405 in order to process the L-ch and R-ch signals LDAT and RDAT. Since the gate circuit sets are the same in arrangement, only one set for L-ch is described for simplicity. AND gate 3400 receives bits LDAT0 and LDAT1 at two inverting inputs, respectively, and produces a high output only when the both inputs are low or the combination of "00". AND gate 3401 receives bits LDAT2 and LDAT3 at two inputs, respectively, and produces a high output only when the both inputs are high or the combination of "11". The outputs from the AND gates 3400 and 3401 are applied to the two inputs, respectively, of a NAND gate 3402 which produces an L-ch enable signal ENB_L which is low only when the both inputs are high, indicating the detection of a bipolar zero level in the L-ch modulated output. Similarly, a NAND gate 3405 produces an R-ch enable signal ENB_R for indicating the detection of a bipolar zero level in the R-ch modulated output.

Referring again to FIG. 3, the control section 36B includes two counter timing controllers 360 and 362 the respective one inputs of which are coupled to the output signal DZERO from the detector 320 and the output signals ENB_L and ENB_R from the detector 340, respectively. The other input of the controller 360 is connected to receive the data-clock DATCK. The controller 360 is a logic comprising gates, inverters and flip-flops, and passes the data-clock DATCK to its first output as a zero-clock signal ZEROCK only when the signal DZERO is high. The controller 360, on the other hand, produces at its second output a clear signal CLEAR which is high when the signal DZERO is low. The outputs from the controller 360 are applied to a counter 361 which measures the length of any period of time of "zero-input" by the number of the data-clock DATCK pulses occurred in that period. The counter 361 is a 65536-counter in this embodiment, which produces at its output a zero-input flag FIX. The zero-input flag FIX goes high when the counter 361 has received continuous 65536 DATCK or ZEROCK pulses and thereafter remains high as long as the pulses are continuously received. Otherwise, the counter 361 is cleared by the signal CLEAR to cause the flag FIX to be reset to low. Since the DATCK is a 2.1168 MHz clock, the number 65536 represents 31 milliseconds, which corresponds to the period of time T1 in FIG. 2. The length of the period is selected taking account of the time-lag induced in the circuit section 2B.

The other counter timing controller 362 has inputs connected to receive the data-clock DATCK from the modulator 22 as well as the output from the detector 340. The controller 362 is a logic comprising gates, inverters and flip-flops, and includes L-ch and R-ch circuits. The L-ch circuit passes the data-clock DATCK as an L-ch count-clock COUNTL when the signal ENB_L is low and produces an L-ch reset signal RSTL which is high when the signal ENB_L is high. Similarly, the R-ch circuit of the controller 362 produces R-ch count-clock COUNTR and R-ch reset signal RSTR. Counter 363 measures the length of any period of time of "zero modulated output" by the number of the data-clock DATCK pulses occurred in that period and includes a pair of 16 counters one for each channel, which output L-ch and R-ch count-out signals COUNT_OUTL and COUNT_OUTR. Each count-out signal goes high when continuous 16 DATCK and thus COUNTL or COUNTR pulses have been received and remains high as long as the pulses are continuously received. Otherwise, the count-out signal returns to low due to the counter reset by the signal RSTL or RSTR. Since DATCK is a 2.1168 MHz clock, the number 16 represents 7.6 microseconds. This corresponds to a period of time during which 16 bipolar zero level data words continuously appears in the modulated output during a zero input period (see FIG. 5). A sequence of 16 or more continuous zero words appears in the modulated output at or greater than a certain probability and is selected as appearing in each intermission between music numbers from almost every music source.

Nevertheless, in case such sequences of 16 or more continuous zero words do not appear, the DAC system B shown in FIG. 3 further includes a counter limit circuit 365 in order to provide a forced mute turn-on or turn-off operation. Specifically, the limit circuit 365 has two inputs connected to receive the flag FIX and the data-clock DATCK, respectively, and produces at its output a "forced zero flag set/reset signal FIX_RST". The limit circuit 365 comprises a logic including gates, and a 4096 counter. When 4096 or more DATCK pulses have been counted after the last transition of the flag FIX either from low to high or vice versa, the limit circuit 365 causes the signal FIX_RST to go high. The circuit 365 causes the signal FIX_RST to be reset to low whenever any transition of the status of the flag FIX occurs during the counting. The number 4096 represents 1.93 millisecond due to the frequency of DATCK.

The outputs of the counters 361 and 363 and limit circuit 365 are coupled to the inputs, respectively, of a status controller 364 which includes a pair of logics, one for each of L- and R-channels, each comprising gates and flip-flops. The status controller 364 produces L-ch and R-ch zero-input-flag-on signals FIX_ONL and FIX_ONR and L-ch and R-ch zero-input-flag-off signals FIX_OFFL and FIX_OFFR. For simplicity, only the signals for L-channel will be described in detail. When the flag FIX undergoes a transition either from low to high or vice versa, then the signals FIX_ONL and FIX_OFFL have the initial statuses of low and high, respectively, and thereafter go low and high, respectively, when the COUNT_OUTL signal or the FIX_RST signal is high during a high or low FIX, thereby indicating the timing to effect mute turn-on and mute turn-off operations, respectively. Signals FIX_ONR and FIX_OFFR for R-channel change their statuses in the same manner, and thus the explanation thereof will be omitted.

A selector 366 is a logic comprising latches and gates and has inputs connected to the outputs of the status controller 364 and the output of the counter 361. The selector 366 outputs L-ch and R-ch zero-setting signals ZEROL and ZEROR. For simplicity, only L-channel will be described. The selector 366 selects and latches the FIX_ONL signal when FIX=1, while selects and latches the FIX_OFFL signal when FIX=0, and outputs the latched signal as the signal ZEROL. The same is true of the signals for R-channel.

Next, the modulated output alteration section 38B will be described. The section 38B comprises an output logic gate 380 which has one input connected to the output of the selector 366 and the other input connected to receive the modulated data words LDAT and RDAT and an output from which output data words LOUT and ROUT are produced.

Figure 8:
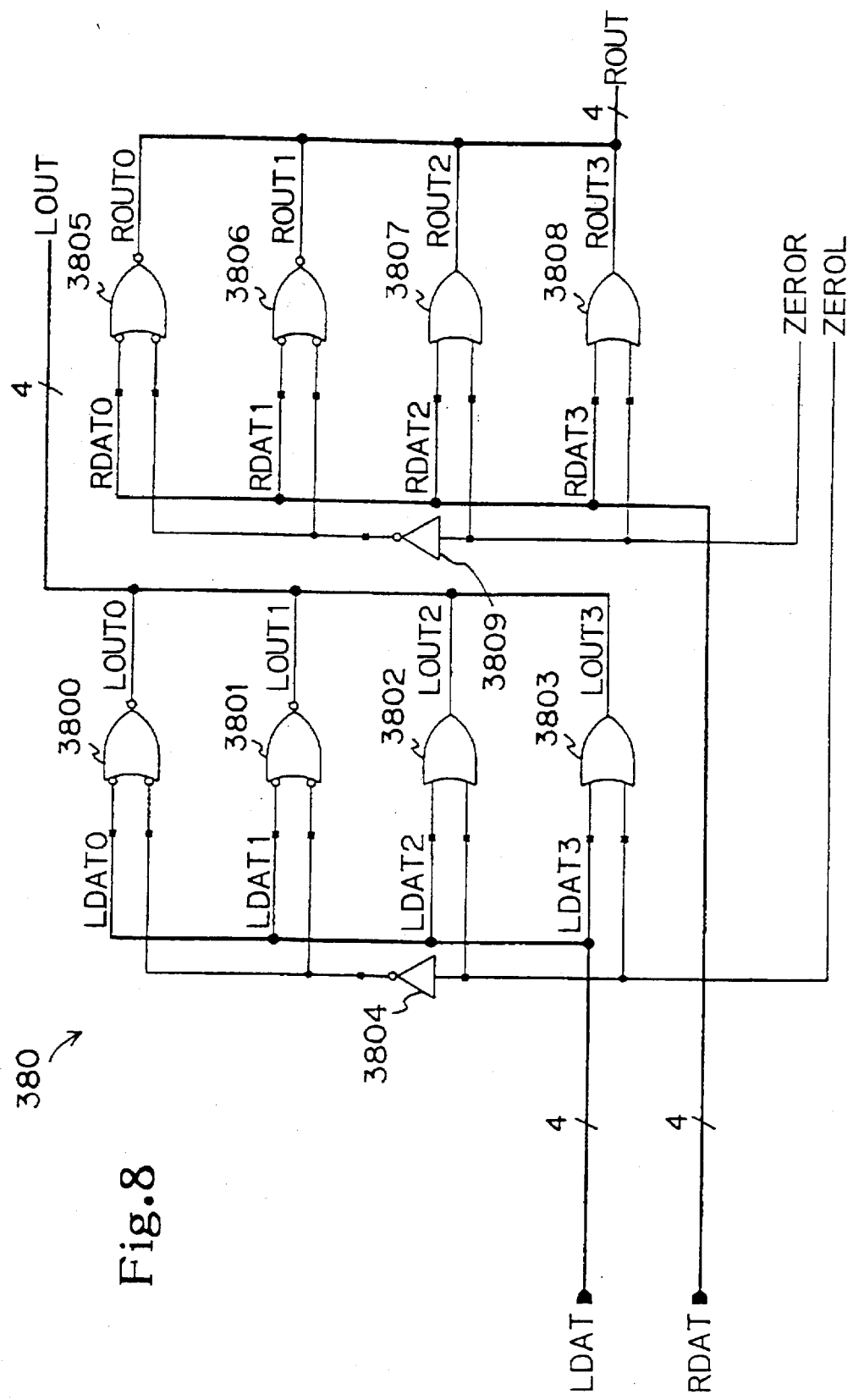
FIG. 8 is a logic diagram showing an output logic gate within the DAC system B shown in FIG. 3 in detail.

With reference to FIG. 8, the output logic gate 380 will be described in more detail. As shown, the output logic gate 380 includes two sets of gate circuits 3800–3804 and 3805–3809 for L- and R-channels, respectively. Since the sets are identical to each other, only one set for L-channel will be described in detail for the sake of simplicity. OR gates 3800 and 3801 has one respective inputs connected to receive bits LDAT0 and LDAT1, respectively, and the other respective inputs connected to receive the inverted ZEROL signal via an inverter 3804. Each of the gates 3800 and 3801 produces an output bit LOUT0 or LOUT1 by passing the input bit to its output when ZEROL=0 (i.e., mute-off), while produces "0" as the output bit LOUT0 or LOUT1 irrespective of the value of the input bit when ZEROL=1 (i.e., mute-on). OR gates 3802 and 3803 have one respective inputs connected to receive bits LDAT2 and LDAT3, respectively, and the other respective inputs connected to receive the ZEROL signal. Each of the gates 3802 and 3803 produces an output bit LOUT2 or LOUT3 by passing the input bit to its output when ZEROL=0, i.e., mute-off, while produces "1" as the output bit LOUT2 or LOUT3 irrespective of the value of the input bit when ZEROL=1, i.e., mute-on. Thus, during a mute-on period, the reference level code "0011" representative of bipolar zero level is produced as the bits LOUT0–3. The other set of gate circuits for R-channel operates in the same manner to produce bits ROUT0–3.

Referring again to FIG. 3, the 4-bit output data words LOUT and ROUT from the output logic gate 380 are coupled to an input of the DAC 40 in the conversion section 4B. The DAC 40 is of a conventional type which is compatible with the modulation scheme of the delta-sigma modulator 22, and converts 4-bit (effectively, 2.5-bit) modulated output data words into analog signals. Specifically, the DAC 40 alternately subjects L-ch and R-ch data words to digital-to-analog conversion so as to produce analog signals LAOUT and RAOUT. The analog signals are then processed by an analog low-pass filter 42 having a cut-off frequency of 100 kHz (−3 dB) so that final output analog signals LAFOUT and RAFOUT are produced at the output terminal 5B.

Referring next to FIGS. 9 to 15, the operation of the overall circuit of FIG. 3 will be described. It should be noted that signal designations without "L" or "R" are used in FIGS. 9, 13 and 15 and associated descriptions due to essentially identical L-ch and R-ch operations.

Figure 9:
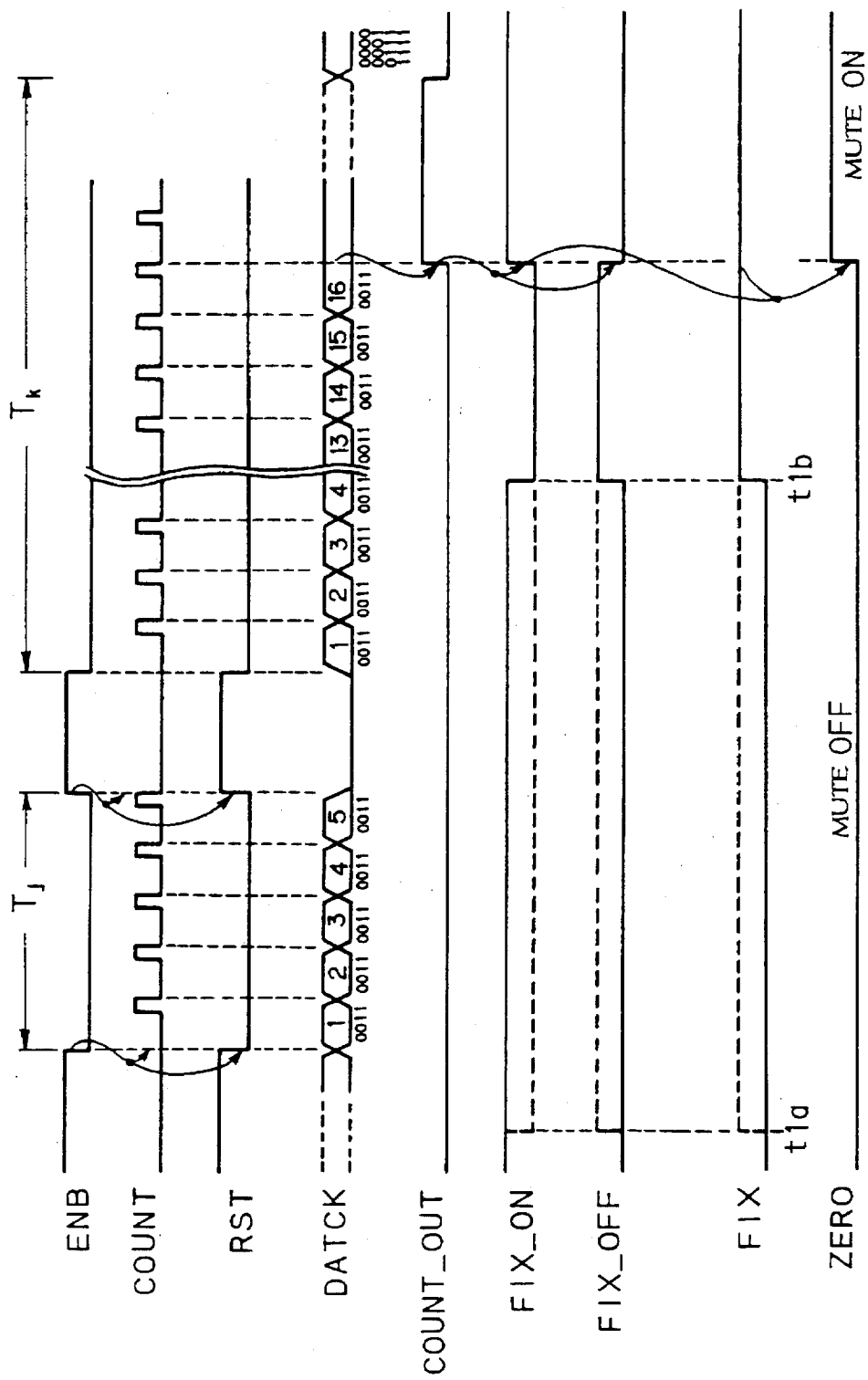
FIG. 9 is a timing chart showing a mute turn-on operation performed by the DAC system B shown in FIG. 3.

FIG. 9 is a timing chart showing an exemplified mute turn-on operation. In this example, it is assumed that the zero input flag FIX goes high at a time between time t1a and time t1b, at which 65536 DATCK pulses have just been counted since a time t0' (not shown) at which the DZERO signal (not shown) went high. The enable signal ENB is low during the periods of time in which the output from the modulator 22 represents bipolar zero level, such as the periods Tj and Tk (see also FIG. 5). During the low ENB signal, DATCK pulses provide counter clock COUNT pulses and also the signal RST is low. In the period Tj, since the signal ENB goes high after the counter 363 counts up to 5, the RST signal goes high to reset the counter 363 and also the COUNT pulses discontinue. In contrast, in the period Tk which is longer than the period Tj, the count of the counter 363 has reached 16 after the ENB signal goes low, causing the COUNT_OUT signal to go high. This causes the FIX_ON and FIX_OFF signals to go high and low, respectively. In this example, it is assumed that the FIX_RST signal remains low. Then, due to FIX=1, the high FIX_ON signal is used as the zero-setting signal ZERO and thus the muting is turned on. Thereafter, even when the COUNT_OUT signal goes low, the statuses of the signals FIX_ON and FIX_OFF as well as that of the ZERO signal do not change, enabling the mute-on state to continue.

Figure 10:
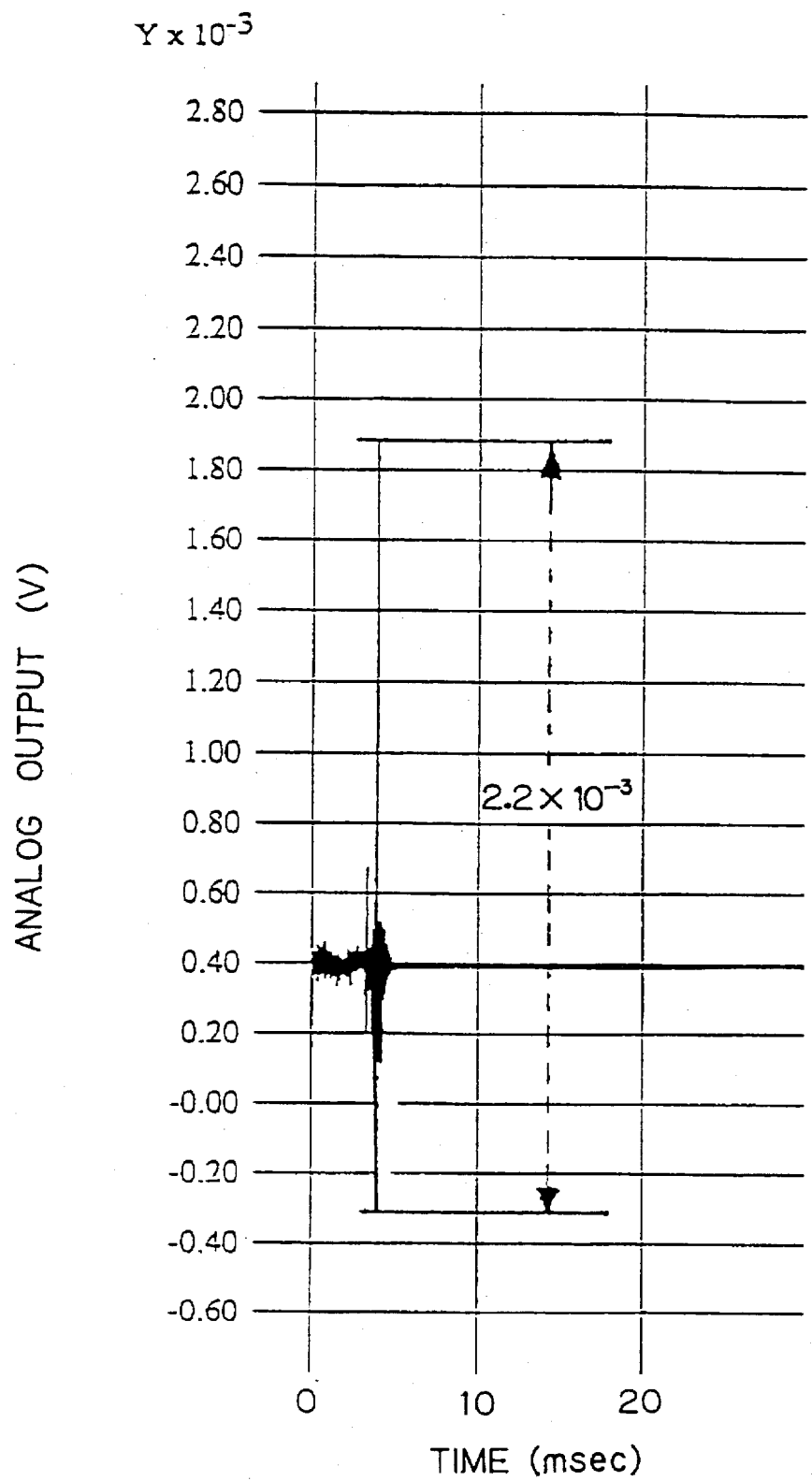
Figure 11:
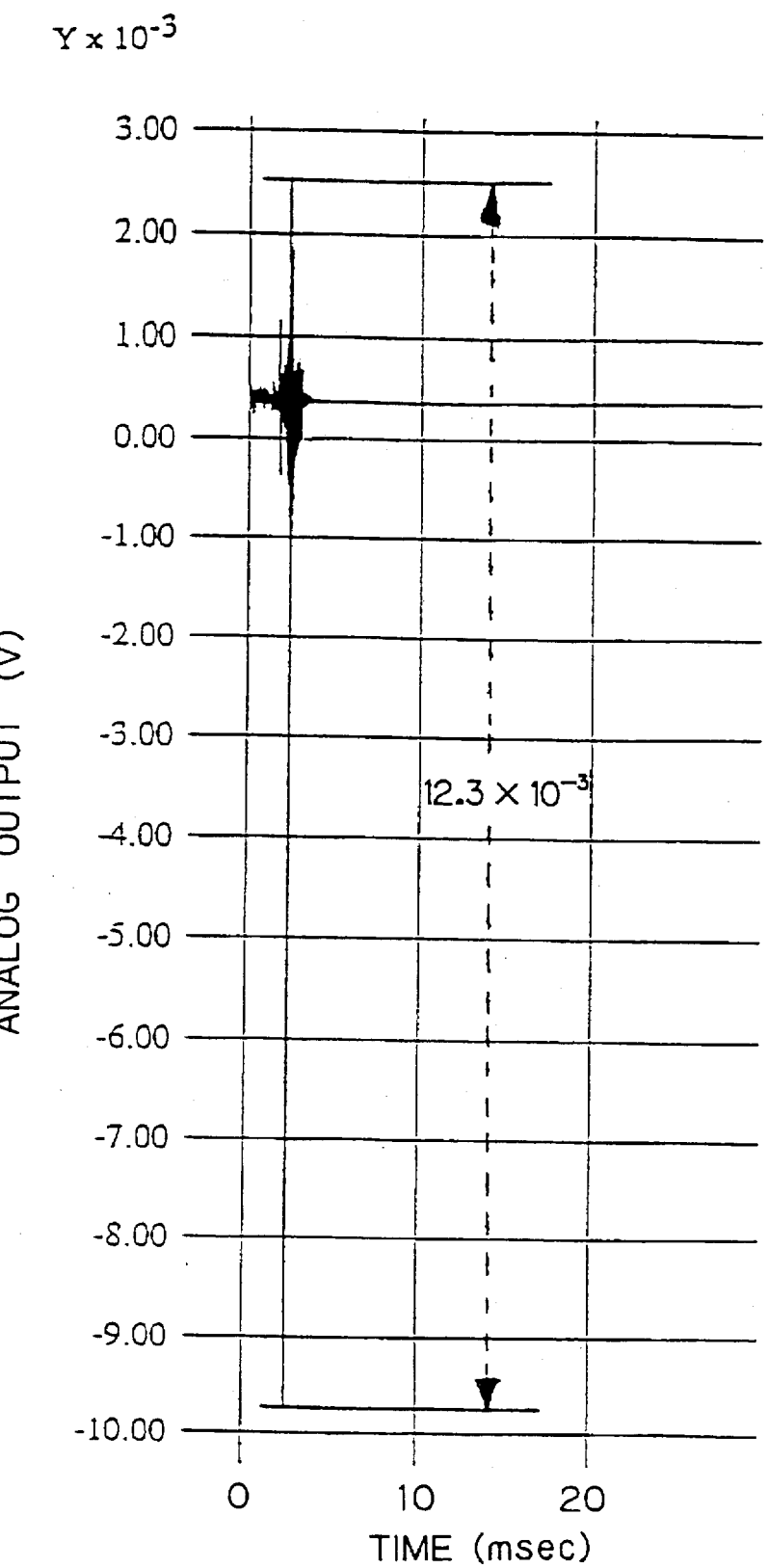
FIG. 11 is similar to FIG. 10, but shows a waveform caused by a mute turn-on operation performed when the modulator output is not at bipolar zero level like a conventional way.
Figure 12:
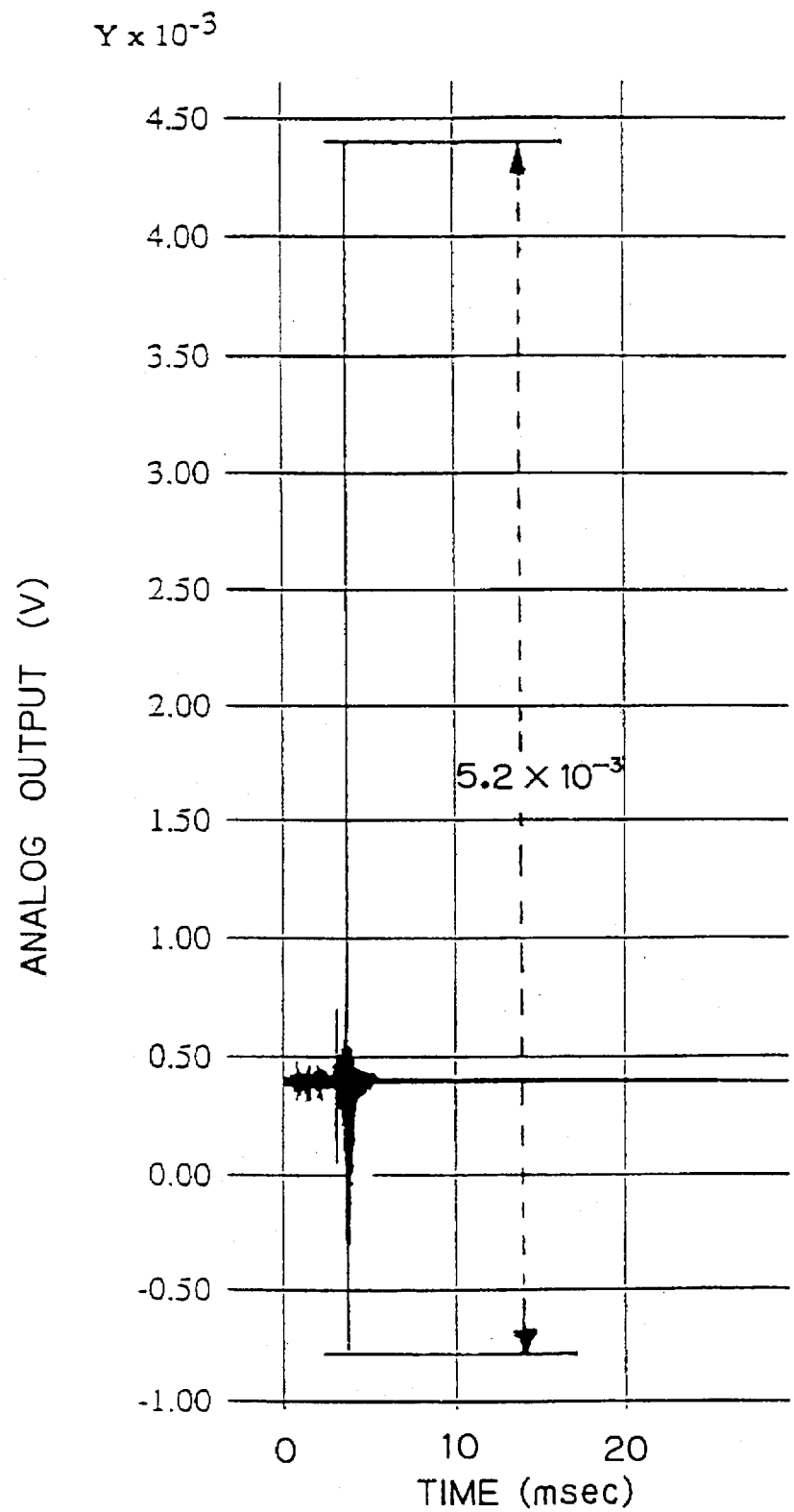
FIG. 12 is similar to FIG. 10, but shows a waveform caused by a mute turn-on operation with the number of consecutive zeroes to be counted by counter 363 in FIG. 3 being reduced from 16 to 8.

FIG. 10 shows a waveform of the analog output signal LAFOUT (or RAFOUT) produced when a switching is performed from mute-off to mute-on, in which pulse noise occurs at the switching with an amplitude of 2.2 mV (millivolts) which is much smaller than that of pulse noise which may occur in conventional systems. This can be better understood by referring to the waveforms shown in FIGS. 11 and 12. FIG. 11 shows a waveform produced if the muting is switched on when the modulator 22 output is not at bipolar zero level, like conventional systems. The amplitude of pulse noise shown in FIG. 11 is as large as 12.3 mV. FIG. 12 shows a waveform produced with the minimum number of continuous zeros to be counted by the counter 363 being reduced from 16 to 8. Even in this case, the amplitude of pulse noise is 5.2 mV which is reduced to one-half that of FIG. 11. Further, the amplitude of the pulse noise will be greatly reduced to 2.2 mV, which is as small as about one-sixth that of FIG. 11, if the number is increased to 16, resulting in that the SNR at mute-on/off switching is improved from 102 dB to 110 dB. It will be understood that the minimum number of continuous zeros is set larger, the amplitude of pulse noise is smaller. However, since the probability of occurrence of a larger number of continuous zeros is smaller, an appropriate number suited for a particular application should be selected.

Figure 13:
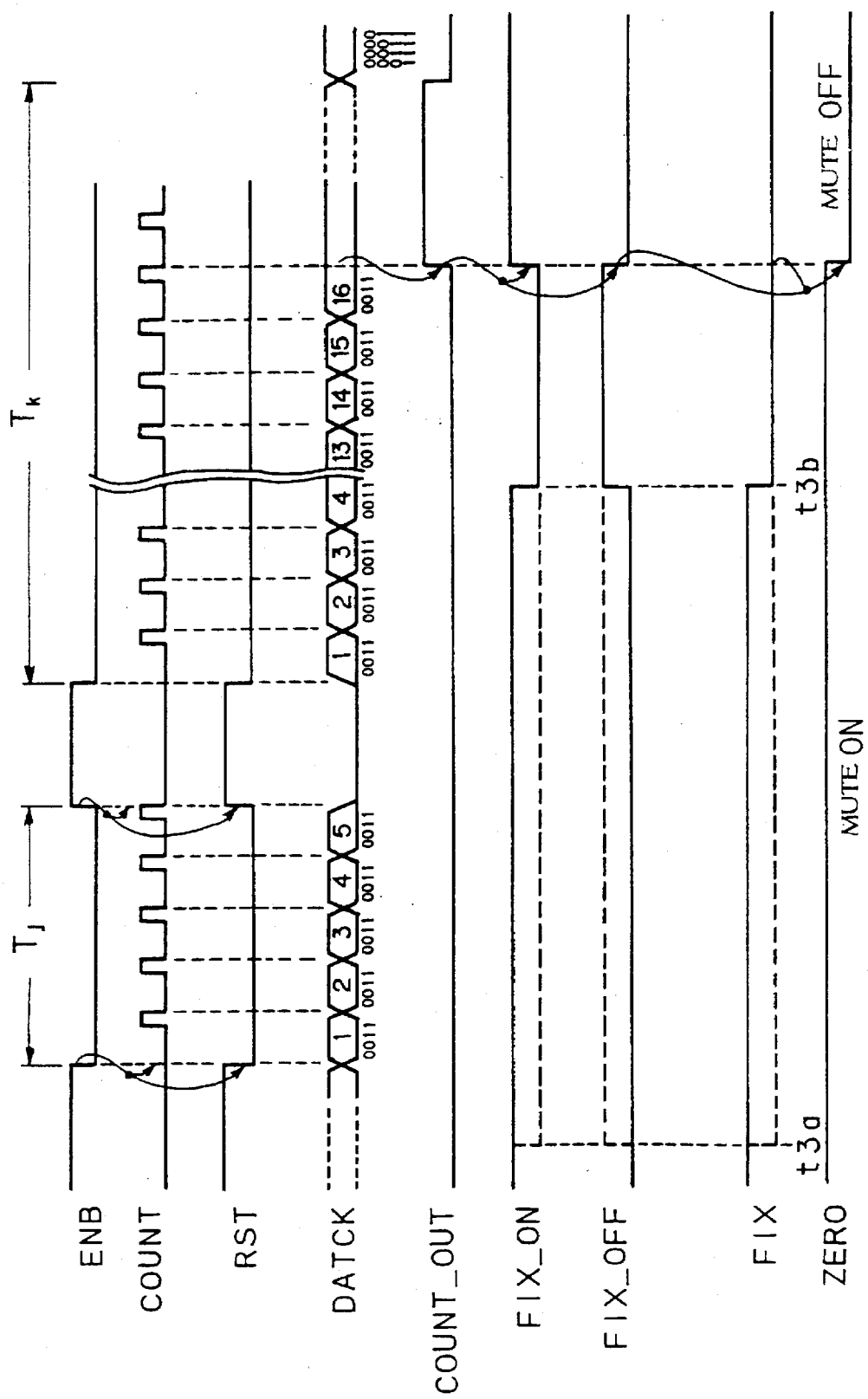
FIG. 13 is a timing chart similar to that of FIG. 9, but showing a mute turn-off operation performed by the DAC system B shown in FIG. 3.

Referring Now to FIG. 13, the timing of the mute turn-off operation will be described. FIG. 13 shows an exemplified operation wherein the zero input flag FIX goes low at a certain time between time t3a and time t3b. Assuming that a modulated output from the modulator 22 varies in the same manner as in the example of FIG. 9, substantially the same operations occur in the periods Tj and Tk as those in the example of FIG. 9. After the counter 363 has counted 16 to raise the signal COUNT_OUT high thereby causing the FIX_ON and FIX_OFF signals to go high and low, respectively, in the period Tk, however, the FIX flag, which is low (FIX=0) in this example, causes the low FIX_OFF signal to be used as the zero-setting signal ZERO, thereby turning the muting off.

Figure 14:
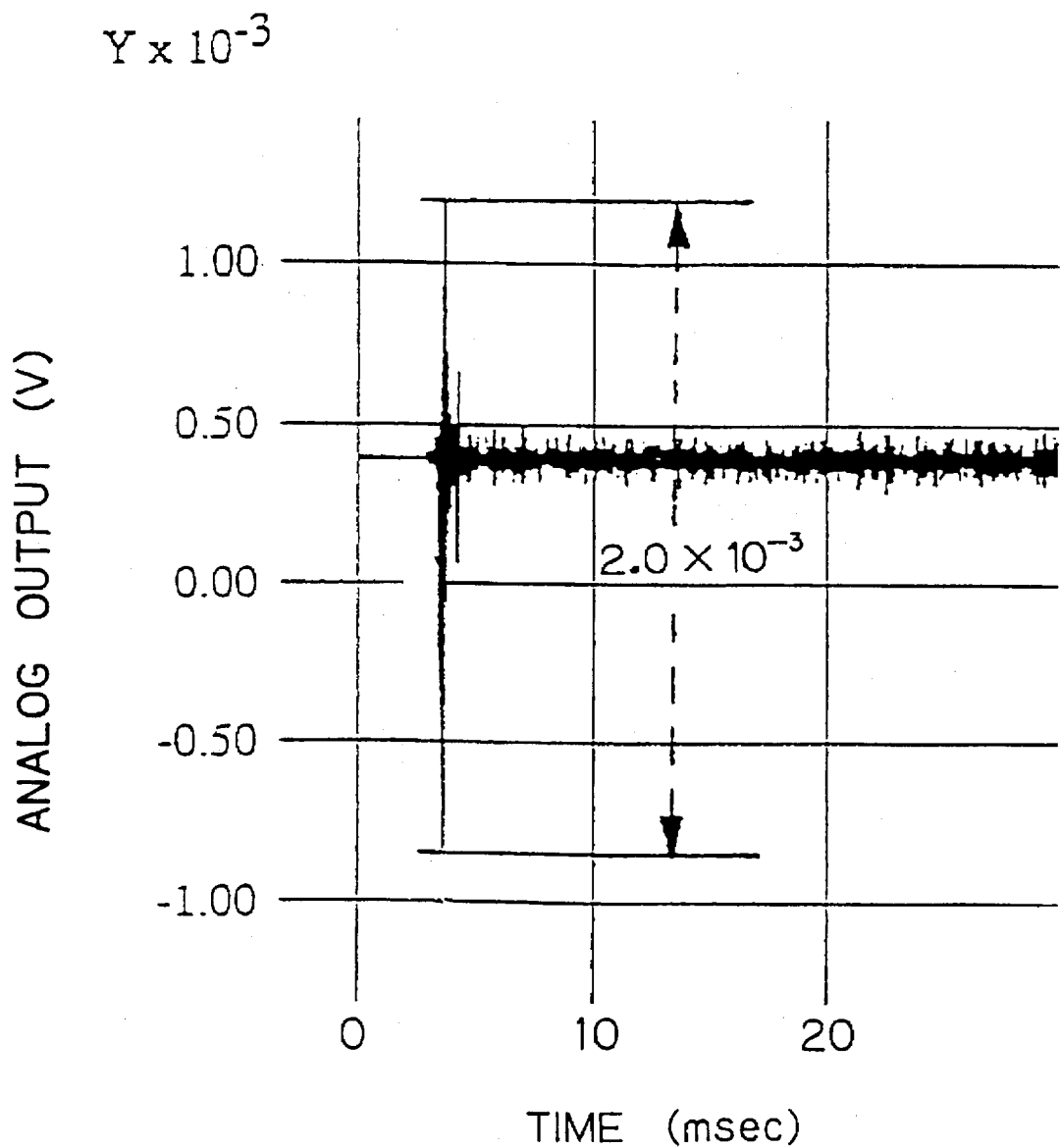
FIG. 14 is similar to FIG. 10, but shows a waveform of the analog output signal produced from the DAC system B shown in FIG. 3 when the muting is switched from on to off.

FIG. 14 shows a waveform of the analog output signal LAFOUT (or RAFOUT) produced when a switching from mute-on to mute-off is performed. Pulse noise occurring at the switching has an amplitude of 2.0 mV, which is much smaller than those of pulse noise which may occur in conventional systems. Such pulse noise may also occur when the muting of the modulator's output is switched from on to off. Thus, since it is known that sequences of continuous bipolar zero level data words appear even when the digital input signal varies from a zero level to a certain non-zero level, the amplitude of the pulse noise occurring at the switching to mute-off can be reduced if the mute turn-off operation is performed during such a sequence of continuous bipolar zero level words.

Figure 15:
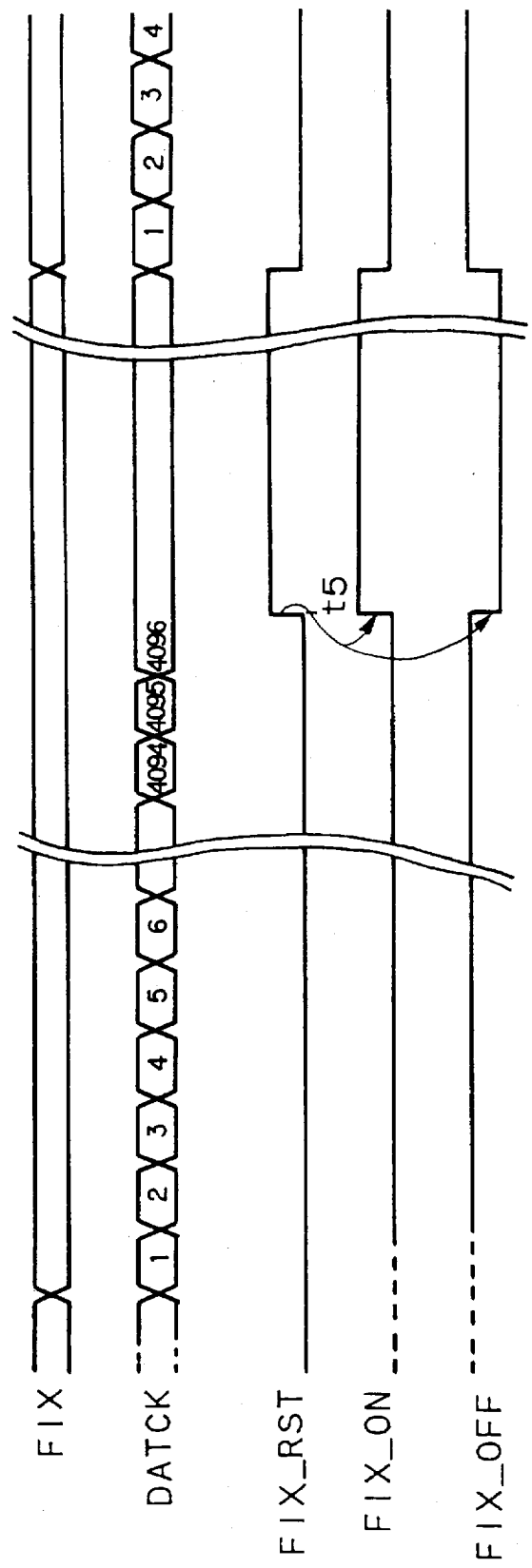
FIG. 15 is a timing chart showing a forced mute turn-on or turn-off caused by a counter limiting circuit within the DAC system B shown in FIG. 3.

Referring now to FIG. 15, the forced mute-on/off switching caused by the counter limit circuit 365 will be described. It is assumed that the status of the FIX flag has changed from low to high. Thereafter, if no bipolar zero period that is sufficiently long like the period Tk should occur, the 4096 counter in the limit circuit 365 causes the FIX_RST signal to rise high at time t5 when 4096 DATCK pulses have been counted. This causes the FIX_ON and FIX_OFF signals to change from low and high to high and low, respectively. As the result, the statuses of the signals are the same as shown in FIG. 9, thereby starting the mute turn-on operation. Similarly, when the status of the FIX flag has changed from high to low, the FIX_ON and FIX_OFF signals will have the same statuses at time t5 as those shown in FIG. 13 which occur after 16-count has just completed, resulting in turning the muting off. This ensures minimal performance of the mute function.

Figure 16:
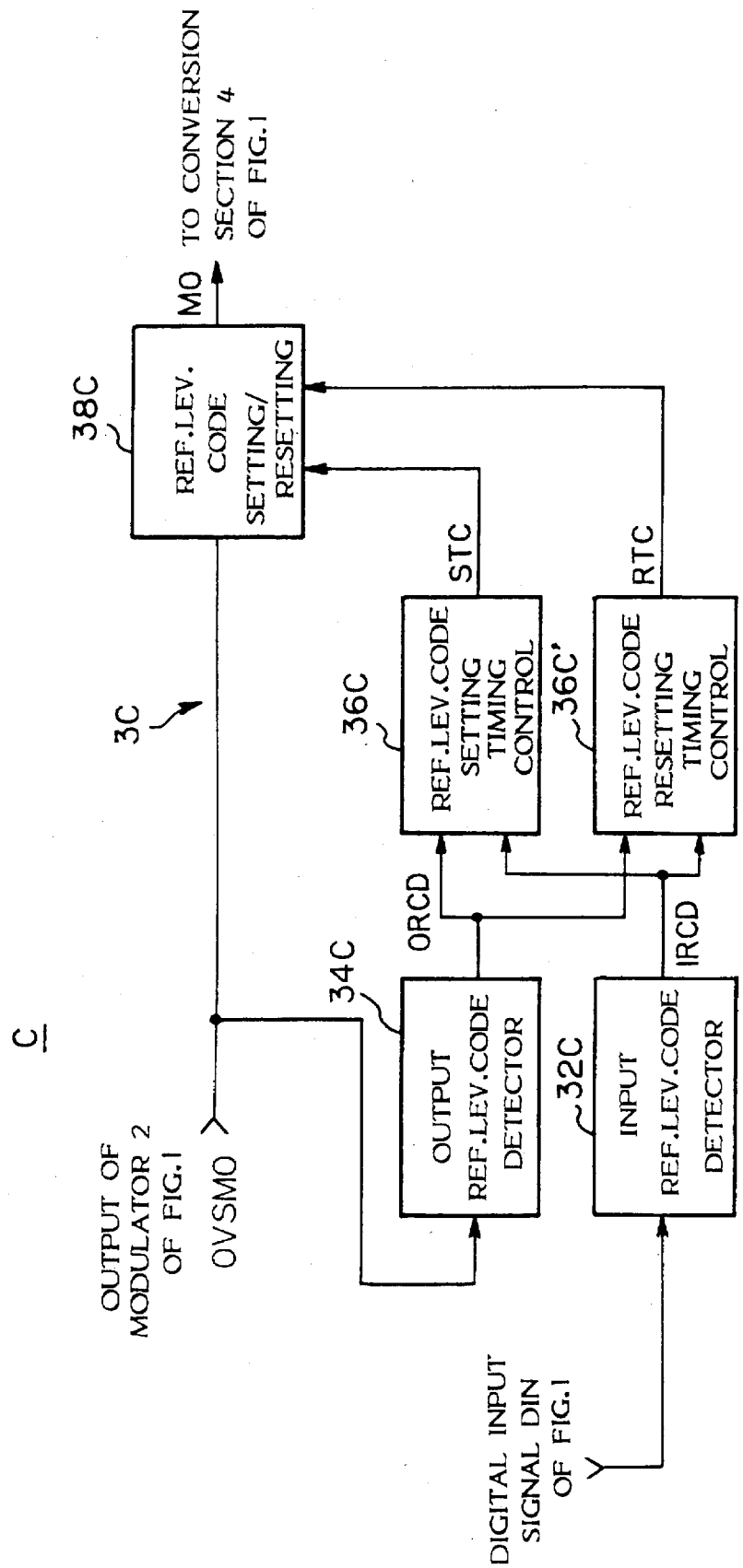
FIG. 16 is a block diagram showing an oversampling DAC system C according to the present invention which forms a third embodiment thereof, in which only the portion of the system C different from the DAC system A of FIG. 1 is shown.

Referring next to FIG. 16, an oversampling DAC system C which is a third embodiment of the present invention will be described. In this figure, only the portion of the system C which is different from the DAC system A shown in FIG. 1, i.e., an auto-muting circuit 3C is illustrated. As seen, the auto-muting circuit 3C includes, unlike the auto-muting circuit 3 of FIG. 1, two separate control sections, i.e., a reference level code setting timing control section 36C and a reference level code resetting timing control section 36C', in place of the alteration timing control section 36 in FIG. 1. This enables the separate controls of the setting timing and the resetting timing. Accordingly, the reference level code setting/resetting section 38C, which corresponds to the modulated output alteration section 38 of FIG. 1, operates to respond to a setting timing control signal STC generated by the control section 36C by setting the substitution of the modulated output with the output reference level code OCRL and respond to a resetting timing control signal RTC generated by the control section 36C' by resetting the substitution. With the arrangement, it is easy to select the minimum number of continuous OCRLs to be used for the substitution setting operation to be equal to 16 like the embodiment in FIG. 3, while the minimum number of continuous OCRLs to be used for the substitution resetting operation to be smaller or greater than 16. This is advantageous where criteria different in between the setting and resetting operations are necessary to determine the time required for an accumulated energy to fall below a predetermined threshold value. Each of the control sections 36C and 36C' may be constructed using a similar circuit arrangement to that of the circuit section 36B of FIG. 3, and the setting/resetting section 38C may be constructed using a similar circuit arrangement to that of the circuit section 38B of FIG. 3, as well.

Figure 17:
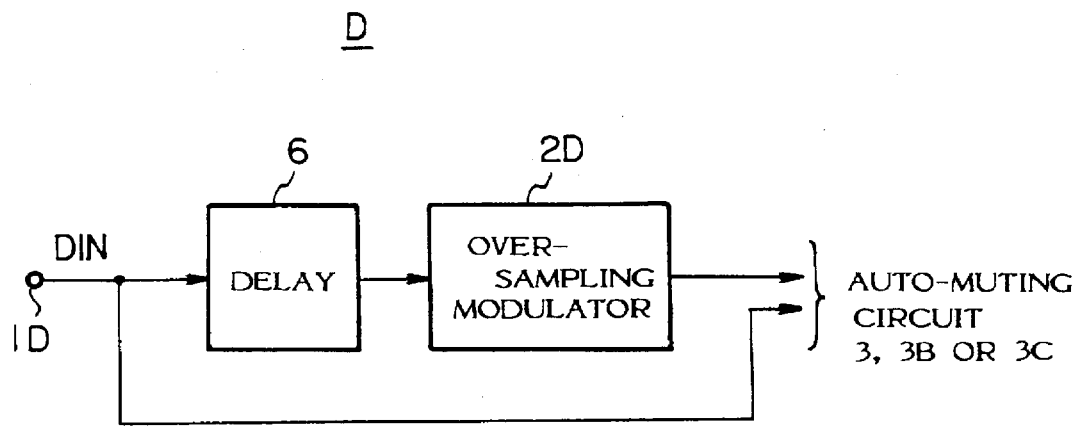
FIG. 17 is a block diagram showing an oversampling DAC system D according to the present invention which forms a fourth embodiment thereof, in which only the portion of the system D different from each of the DAC systems A, B and C in FIGS. 1, 3 and 16 is shown.

Referring now to FIG. 17, an oversampling DAC system D which is a fourth embodiment of the present invention will be described. Again, only the portion of the DAC system D that is modified and thus different from each of the DAC systems shown in FIGS. 1, 3 and 16 is illustrated. The modification is that the oversampling modulator 2D is preceded or followed by a delay circuit 6 which provides a delay of 0.5 milliseconds, for example. FIG. 17 shows the former case. The delay circuit 6 may be implemented by a group delay of a digital filter. The provision of the delay circuit 6 is advantageous where an abrupt change in the digital input signal DIN from zero value to a certain large non-zero amplitude value would result in a reduction of the number of OCRLs within each of sequences of continuous OCRLs which may appear in the modulated digital output from the oversampling modulator 2D. Provision of the delay circuit 6 enables alteration (or substitution) to be performed before the change of the modulated digital output to a large amplitude, that is, during the period of time in which a greater number of continuous zero levels are present in the modulator output. In this case, the full count of the counter 361 in the DAC system B of FIG. 3 may be changed appropriately.

Figure 18:
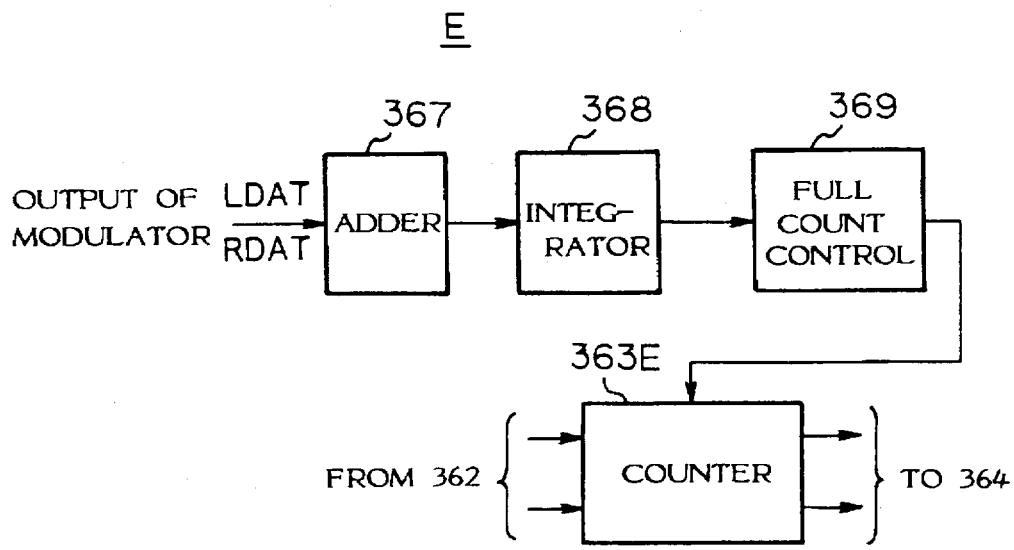
FIG. 18 is a block diagram showing an oversampling DAC system E according to the present invention which forms a fifth embodiment thereof, in which only the portion of the system E different from the DAC system B is shown.

Referring next to FIG. 18, an oversampling DAC system E which is a fifth embodiment of the present invention will be described. Again, only the portion of the DAC system E that is different from that of the DAC system B of FIG. 3 is shown. The fifth embodiment provides dynamic variation of the minimum number of continuous zero levels in the modulator output to be counted. The time when the accumulated energy of the modulator's output at a given time falls below the predetermined value (see FIG. 2) is determined from the amount of the accumulated energy which depends on the history of status of the modulator output during a certain period of time before the given time, and thus the time of the switching between mute-on and mute-off is advanced if the amount of the accumulated energy is relatively small, and delayed if the amount is relatively large. More specifically, the circuit shown includes an adder 367 connected to receive the modulator's outputs LDAT and RDAT to derive the quantization level represented by each of the modulator's outputs by way of addition, an integrator 368 connected to receive the L-ch and R-ch additions to integrate each of them, and a full-count controller 369 connected to receive the L-ch and R-ch integrals. The full-count controller 369 adjusts the full count of each of L-ch and R-ch counters within a counter 363E in response to the L-ch and R-ch integrals, respectively, in a continuous or stepwise manner. This enables the timing of the switching between mute-on and mute-off to be determined in a dynamic manner, thereby providing enhanced flexibility.

Figure 19:
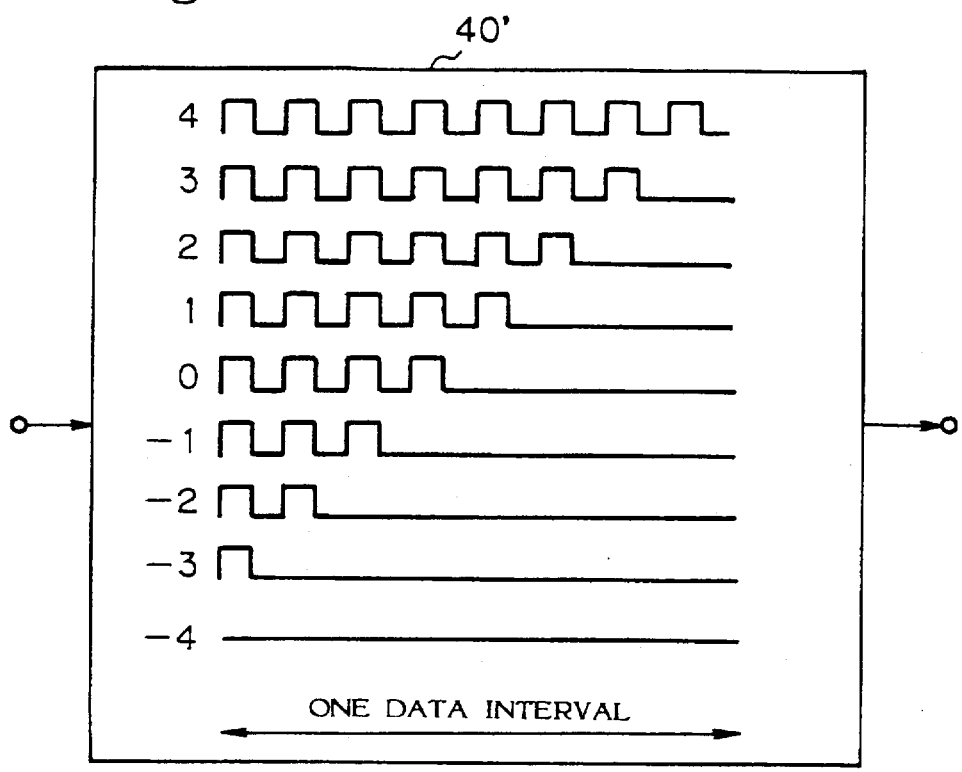
FIG. 19 shows a pulse-density modulator which may be used in place of the DAC 40 in FIG. 3, wherein different pulse-density modulated signals are shown.
Figure 20:
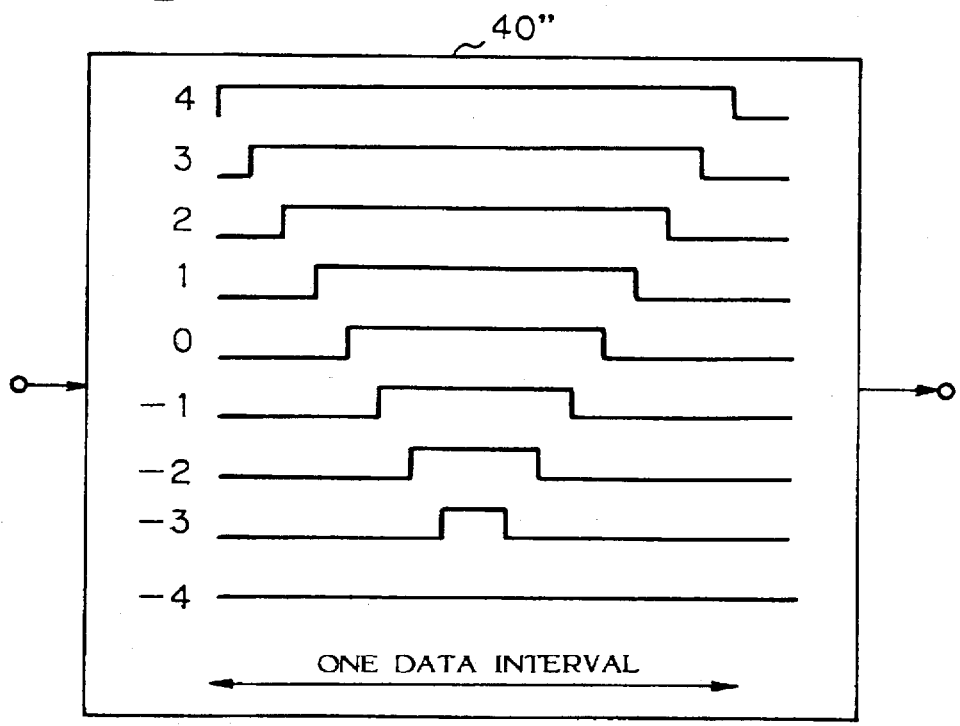
FIG. 20 shows a pulse-width modulator which may be used in place of the DAC 40 in FIG. 3, wherein different pulse-width modulated signals are shown.

While several embodiments of the present invention have been described, the following modifications and alterations may be made. First, although the embodiment shown in FIG. 3 employs the multi-level, multi-bit delta-sigma modulator 22 as an oversampling modulator, a multi-level, single-bit, pulse-density-modulation (PDM) delta-sigma modulator or a multi-level, single-bit, pulse-width-modulation (PWM) delta-sigma modulator may be employed as the oversampling modulator. Then, a PDM modulator 40' shown in FIG. 19 or a PWM modulator 40" shown in FIG. 20 may be used in place of the DAC 40. Further, in such cases, the reference level code does not correspond to a bipolar zero level, but may correspond to a 50% pulse density modulated signal when a PDM modulator such as shown in FIG. 19 is used or to a 50% pulse width modulated signal when a PWM modulator such as shown in FIG. 20 is used. Thus, in such cases, the detector 340 may be modified to an arrangement for detecting such an associated reference level code. Secondly, the minimum number of continuous reference level codes in the modulator's output to be counted may be modified depending upon a requirement on the amplitude of noise.

As will be understood from the foregoing description, the oversampling DAC system with the auto-muting feature according to the present invention provides the reduction of pulse noise occurring at the switching between mute-on and mute-off. Thus, noise during each of silent periods such as intermissions between recorded music numbers can be reduced, and the SNR at the switching is highly improved.

For example, the basic technique of the invention is also applicable to analog-to-digital conversion. However, in the case of analog-to-digital conversion, it is not possible to detect an exact zero code for a zero analog input because an analog zero input is usually very noisy. Furthermore, the output code produced by a delta-sigma modulator in response to such analog zero input contains an out-band signal component of higher frequency even for a small signal. Therefore, the analog zero input condition must be detected after the output of the ADC delta sigma converter has been filtered by a decimation filter. The noisy analog zero input signal can be detected as an output code of the decimation filter corresponding to a specified small analog input signal.

What is claimed is:

1. An auto-muting circuit for use in an oversampling digital-to-analog converter for converting a digital input signal to an analog output signal, said converter including an oversampling modulator means for receiving said digital input signal and subjecting the digital input signal to oversampling modulation to produce a first modulated output signal, said auto-muting circuit comprising:

a) modulated output alteration means connected to receive said first modulated output signal for generating a second modulated output signal, said second modulated output signal being equal to to said first modulated output signal in a first status and a reference level code for said oversampling modulator means in a second status;

b) input reference level code detector means connected to receive said digital input signal for generating an input reference level code detection signal when a reference level code for said digital input signal is detected in said digital input signal;

c) output reference level code detector means connected to receive said first modulated output signal for generating an output reference level code detection signal when a reference level code for said oversampling modulation is detected in said first modulated output signal, and d) modulated output alteration timing control means connected to receive said input and output reference level code detection signals for generating an alteration timing control signal, said alteration timing control signal selectively indicating one of said first and second statuses to said modulated output alteration means in response to said input and output reference level code detection signals.

2. An auto-muting circuit set forth in claim 1, wherein said modulated output alteration timing control means is operative to:

i) change in said alteration timing control signal from said first status to said second status at a first point of time at which said input reference level code detection signal has continued for a period of time equal to or longer than a first period of time and at which said output reference level code detection signal is present; and ii) change in status said alteration timing control signal from said second status to said first status at a second point of time at which said input reference level code detection signal has become absent after having continued for a period of time equal to or longer than said first period of time and at which said output reference level code detection signal is present.

3. An auto-muting circuit set forth in claim 1, wherein: each of said first and second points of time is a point of time at which the value of the accumulated energy of said first modulated output signal is below a predetermined value.

4. An auto-muting circuit set forth in claim 2, wherein said modulated output alteration timing control means is operative to:

i) change in status said alteration timing control signal from said first status to said second status when said input reference level code detection signal has continued for a period of time equal to or longer than a first period of time and if said output reference level code detection signal has continued for a second period of time; and ii) change in status said alteration timing control signal from said second status to said first status when said input reference level code detection signal has become absent after having continued for a period of time equal to or longer than said first period of time and if said output reference level code detection signal has continued for a third period of time.

5. An auto-muting circuit set forth in claim 4, wherein: said second and third periods of time have different lengths from each other.

6. An auto-muting circuit set forth in claim 4, wherein said modulated output alteration timing control means comprises:

i) first counter means for measuring said first period of time by counting a first number of continuously generated said input reference level code detection signals;

ii) second counter means for measuring said second period of time by counting a second number of continuously generated said output reference level code detection signals; and iii) third counter means for measuring said third period of time by counting a third number of continuously generated said output reference level code detection signals.

7. An auto-muting circuit set forth in claim 4, wherein: said second and third periods of time have the same length.

8. An auto-muting circuit set forth in claim 7, wherein said modulated output alteration timing control means comprises:

i) first counter means for measuring said first period of time by counting a first number of continuously generated said input reference level code detection signals; and ii) second counter means for measuring said second period of time by counting a second number of continuously generated said output reference level code detection signals.

9. An auto-muting circuit set forth in claim 4, wherein: each of said second and third periods of time is of a fixed length.

10. An auto-muting circuit set forth in claim 4, wherein: each of said second and third periods of time is of a variable length.

11. An auto-muting circuit set forth in any one of claims 1 to 10, wherein said oversampling digital-to-analog converter further comprises:

conversion means connected to receive said second modulated output signal for converting said second modulated output signal to said analog output signal to produce the resultant signal at said output terminal.

12. An auto-muting circuit set forth in claim 11 wherein said conversion means comprises:

digital pulse conversion means for receiving and converting said second modulated output signal to an analog signal.

13. An auto-muting circuit set forth in claim 11, wherein said conversion means comprises:

i) digital pulse conversion means for receiving and converting said second modulated output signal to an analog signal; and ii) an analog filter for receiving said analog signal to produce said analog output signal.

14. An auto-muting circuit set forth in claim 12 or 13, wherein:

i) said oversampling modulator includes a delta-sigma modulator for producing said first modulated output signal as a multi-quantization-level and multi-bit signal; and ii) said digital pulse conversion means includes a multi-bit digital-to-analog converter.

15. An auto-muting circuit set forth in claim 14, wherein: said output reference level code is a bipolar zero level code.

16. An auto-muting circuit set forth in claim 12 or 13, wherein:
  i) said oversampling modulator includes a delta-sigma modulator for producing said first modulated output signal as a multi-quantization-level, single-bit and pulse-width-modulated signal; and
  ii) said digital pulse conversion means includes a pulse-width converter.

17. An auto-muting circuit set forth in claim 12 or 13, wherein:
  i) said oversampling modulator includes a delta-sigma modulator for producing said first modulated output signal as a multi-quantization-level, single-bit and pulse-density-modulated signal; and
  ii) said digital pulse conversion means includes a pulse-density converter.

18. An oversampling digital-to-analog converter for converting a digital input signal to an analog output signal, comprising:
  a) an input terminal for receiving said digital input signal;
  b) an output terminal for producing said analog output signal representative of said digital input signal;
  c) oversampling modulator means connected to receive said digital input signal from said input terminal for generating a first modulated output signal, said first modulated signal being derived by subjecting the digital input signal to oversampling modulation;
  d) modulated output alteration means connected to receive said first modulated output signal for generating a second modulated output signal, said second modulated output signal being equal to said first modulated output signal in a first status and a reference level code for said oversampling modulator means in a second status;
  e) conversion means connected to receive said second modulated output signal for converting said second modulated output signal to said analog output signal to produce the resultant signal at said output terminal;
  f) input reference level code detector means connected to receive said digital input signal from said input terminal for generating an input reference level code detection signal when a reference level code for said digital input signal is detected in said digital input signal;
  g) output reference level code detector means connected to receive said first modulated output signal for generating an output reference level code detection signal when a reference level code for said oversampling modulation is detected in said first modulated output signal; and
  h) modulated output alteration timing control means connected to receive said input and output reference level code detection signals for generating an alteration timing control signal, said alteration timing control signal selectively indicating one of said first and second statuses to said modulated output alteration means in response to said input and output reference level code detection signals.

19. An oversampling digital-to-analog converter set forth in claim 18, wherein said modulated output alteration timing control means is operative to:
  i) change in status said alteration timing control signal from said first status to said second status at a first point of time at which said input reference level code detection signal has continued for a period of time equal to or longer than a first period of time and at which said output reference level code detection signal is present; and
  ii) change in status said alteration timing control signal from said second status to said first status at a second point of time at which said input reference level code detection signal has become absent after having continued for a period of time equal to or longer than said first period of time and at which said output reference level code detection signal is present.

20. An oversampling digital-to-analog converter set forth in claim 19, wherein:
  each of said first and second points of time is a point of time at which the value of the accumulated energy of said first modulated output signal is below a predetermined value.

21. An oversampling digital-to-analog converter set forth in claim 18, wherein said modulated output alteration timing control means is operative to:
  i) change in status said alteration timing control signal from said first status to said second status when said input reference level code detection signal has continued for a period of time equal to or longer than a first period of time and if said output reference level code detection signal has continued for a second period of time; and
  ii) change in status said alteration timing control signal from said second status to said first status when said input reference level code detection signal has become absent after having continued for a period of time equal to or longer than said first period of time and if said output reference level code detection signal has continued for a third period of time.

22. An oversampling digital-to-analog converter set forth in claim 21, wherein:
  said second and third periods of time have different lengths from each other.

23. An oversampling digital-to-analog converter set forth in claim 21, wherein said modulated output alteration timing control means comprises:
  i) first counter means for measuring said first period of time by counting a first number of continuously generated said input reference level code detection signals;
  ii) second counter means for measuring said second period of time by counting a second number of continuously generated said output reference level code detection signals; and
  iii) third counter means for measuring said third period of time by counting a third number of continuously generated said output reference level code detection signals.

24. An oversampling digital-to-analog converter set forth in claim 21, wherein:
  said second and third periods of time have the same length.

25. An oversampling digital-to-analog converter set forth in claim 24, wherein said modulated output alteration timing control means comprises:
  i) first counter means for measuring said first period of time by counting a first number of continuously generated said input reference level code detection signals; and
  ii) second counter means for measuring said second period of time by counting a second number of continuously generated said output reference level code detection signals.

26. An oversampling digital-to-analog converter set forth in claim 21, wherein:

each of said second and third periods of time is of a fixed length.

27. An oversampling digital-to-analog converter set forth in claim 21, wherein:

each of said second and third periods of time is of a variable length.

28. An auto-muting circuit for use in an oversampling digital-to-analog converter for converting a digital input signal to an analog output signal, the converter including an oversampling modulator receiving the digital input signal and subjecting the digital input signal to oversampling modulation to produce a first modulated output signal, the auto-muting circuit comprising:

a) a modulated output alteration circuit connected to receive the first modulated output signal and generating a second modulated output signal, the second modulated output signal being equal to the first modulated output signal in a first status and a reference level code for the oversampling modulator means in a second status;

b) an output reference level code detector connected to receive the first modulated output signal and generating an output reference level code detection signal when a reference level code for the oversampling modulation is detected in the first modulated output signal; and c) a modulated output alteration timing control circuit connected to receive the output reference level code detection signal and generating an alteration timing control signal, the alteration timing control signal selectively indicating one of the first and second statuses to the modulated output alteration means in response to the output reference level code detection signal.

29. In an oversampling analog-to-digital converter for converting an analog input signal to a digital output signal, the converter including an oversampling modulator receiving the analog input signal to produce a first modulated output signal, a method of automatically muting the digital output signal when the analog input signal represents a reference level code, comprising the steps of:

a) providing an output reference level code detection signal when a reference level code for an output of a decimation filter receiving the first modulated output signal from the oversampling modulation is detected in an output signal produced by the decimation filter;

b) providing an alteration timing control signal, the alteration timing control signal indicating one of first and second statuses in response to the output reference level code detection signal; and c) causing the first modulated output signal to be output as an output of the decimation filter when the alteration timing control signal indicates the first status, and causing the reference level code for the decimation filter to be output as the output decimation filter when the alteration timing control signal indicates the second status.

30. In an oversampling digital-to-analog converter for converting a digital input signal to an analog output signal, said converter including an oversampling modulator receiving said digital input signal to produce a first modulated output signal, a method of automatically muting said analog output signal when said digital input signal represents a predetermined input reference level code, comprising the steps of:

(a) detecting said predetermined input reference level code in said digital input signal;

(b) generating an input reference level code detection signal in response to said detecting of said predetermined input reference level code in said digital input signal;

(c) operating said oversampling modulator to generate a modulated output reference level code in said first modulated output signal in response to said predetermined input reference level code;

(d) detecting the modulated output reference output level code in said first modulated output signal;

(e) generating an output reference level code detection signal in response to the detected modulated output reference level code;

(f) generating an alteration timing control signal, said alteration timing control signal indicating one of first and second statuses in response to said input reference level code detection signal and said output reference level code detection signal; and (g) causing said first modulated output signal to be provided as an output of said digital-to-analog converter in response to an indication of said first status by said alteration timing control signal, and causing said modulated output reference level code to be provided as the output of said analog-to-digital converter in response to an indication of said second status by said timing control signal, wherein the generating of the alteration timing control signal includes i. changing said alteration timing control signal from said first status to said second status at a first point in time at which said input reference level code detection signal has continued for a period of time equal to or longer than a first period of time and at which said output reference level code detection signal is present, and ii. changing said alteration timing control signal from said second status to said first status at a second point in time at which said input reference level code detection signal has become absent after having continued for a period of time equal to or longer than said first period of time and at which said output reference level code detection signal is present, wherein at each of said first and second points in time the value of the accumulated energy of said first modulated output signal is below a predetermined value.

* * * * *